(12) United States Patent
Park et al.

(10) Patent No.: US 10,559,583 B2
(45) Date of Patent: Feb. 11, 2020

(54) MEMORY DEVICE

(71) Applicants: Su Jin Park, Gwangmyeong-si (KR);
Sun Young Kim, Seongnam-si (KR);
Jang Gn Yun, Hwaseong-si (KR)

(72) Inventors: Su Jin Park, Gwangmyeong-si (KR);
Sun Young Kim, Seongnam-si (KR);
Jang Gn Yun, Hwaseong-si (KR)

(73) Assignee: Samsung Electronics Co., Ltd.,
Suwon-si, Gyeonggi-do (KR)

(*) Notice: Subject to any disclaimer, the term of this patent is extended or adjusted under 35 U.S.C. 154(b) by 0 days.

(21) Appl. No.: 15/415,248

(22) Filed: Jan. 25, 2017

(65) Prior Publication Data
US 2018/0026047 A1    Jan. 25, 2018

(30) Foreign Application Priority Data
Jul. 20, 2016 (KR) .................. 10-2016-0091946

(51) Int. Cl.
| H01L 27/11582 | (2017.01) |
| H01L 27/11565 | (2017.01) |
| H01L 27/11575 | (2017.01) |
| H01L 27/1157  | (2017.01) |
| H01L 23/528   | (2006.01) |
| H01L 27/11556 | (2017.01) |

(52) U.S. Cl.
CPC ...... H01L 27/11582 (2013.01); H01L 23/528 (2013.01); H01L 27/1157 (2013.01); H01L 27/11556 (2013.01); H01L 27/11565 (2013.01); H01L 27/11575 (2013.01)

(58) Field of Classification Search
CPC ............ H01L 27/11582; H01L 23/528; H01L 27/11556; H01L 27/11578; H01L 29/7926
See application file for complete search history.

(56) References Cited

U.S. PATENT DOCUMENTS

2009/0310425 A1* 12/2009 Sim .................. H01L 27/11526
                                                365/185.29
2010/0097859 A1*  4/2010 Shim ....................... G11C 5/02
                                                365/185.05

(Continued)

FOREIGN PATENT DOCUMENTS

| CN | 104733462 A | 6/2015 |
| JP | 2011-138945 A | 7/2011 |

(Continued)

*Primary Examiner* — Bitew A Dinke
(74) *Attorney, Agent, or Firm* — Volentine, Whitt & Francos, PLLC

(57) ABSTRACT

A memory device includes gate electrode layers stacked on an upper surface of a substrate and each including a plurality of unit electrodes extending in a first direction, and a plurality of connecting electrodes connecting the unit electrodes to each other. The memory device also includes channel structures extending through the gate electrode layers in a direction perpendicular to the upper surface of the substrate, first common source lines extending in the first direction and interposed between the unit electrodes, and second common source lines extending in the first direction between the first common source lines and each having a first line and a second line separated from each other in the first direction by the connecting electrodes.

19 Claims, 37 Drawing Sheets

(56) References Cited

U.S. PATENT DOCUMENTS

| | | | |
|---|---|---|---|
| 2011/0092038 A1* | 4/2011 | Choi | H01L 27/11526 438/268 |
| 2011/0147801 A1* | 6/2011 | Shim | H01L 27/11551 257/211 |
| 2011/0199804 A1* | 8/2011 | Son | G11C 5/04 365/51 |
| 2011/0227141 A1* | 9/2011 | Jeong | H01L 27/11578 257/324 |
| 2011/0244666 A1* | 10/2011 | Kim | H01L 27/11551 438/478 |
| 2011/0286275 A1* | 11/2011 | Jeon | G11C 16/0483 365/185.17 |
| 2012/0003800 A1* | 1/2012 | Lee | H01L 27/11551 438/261 |
| 2013/0009229 A1* | 1/2013 | Lee | H01L 29/66833 257/314 |
| 2013/0126957 A1 | 5/2013 | Higashitani et al. | |
| 2013/0256775 A1 | 10/2013 | Shim et al. | |
| 2014/0110795 A1* | 4/2014 | Oh | H01L 27/11573 257/401 |
| 2014/0145255 A1 | 5/2014 | Seol et al. | |
| 2014/0231954 A1* | 8/2014 | Lue | H01L 27/11524 257/528 |
| 2014/0286095 A1* | 9/2014 | Hishida | G11C 16/0483 365/185.05 |
| 2014/0346682 A1* | 11/2014 | Lee | H01L 27/11565 257/776 |
| 2015/0035036 A1* | 2/2015 | Konno | H01L 27/11565 257/314 |
| 2015/0041903 A1* | 2/2015 | Oh | H01L 21/28008 257/368 |
| 2015/0084115 A1 | 3/2015 | Kim et al. | |
| 2015/0137216 A1* | 5/2015 | Lee | H01L 27/11582 257/329 |
| 2015/0179564 A1 | 6/2015 | Lee et al. | |
| 2015/0194435 A1 | 7/2015 | Lee | |
| 2015/0287479 A1* | 10/2015 | Nam | G11C 29/025 714/721 |
| 2015/0380097 A1* | 12/2015 | Sato | G11C 8/08 365/185.03 |
| 2016/0005762 A1* | 1/2016 | Lue | G11C 11/5671 365/185.03 |
| 2016/0111361 A1* | 4/2016 | Oh | H01L 27/11548 257/390 |
| 2016/0190155 A1* | 6/2016 | Lee | H01L 27/11582 438/268 |
| 2016/0260663 A1* | 9/2016 | Chen | H01L 27/11565 |
| 2016/0268302 A1* | 9/2016 | Lee | H01L 27/11582 |
| 2016/0293627 A1* | 10/2016 | Kim | H01L 27/11582 |
| 2016/0315089 A1* | 10/2016 | Ito | H01L 27/11565 |
| 2016/0322378 A1* | 11/2016 | Ito | H01L 27/11582 |
| 2017/0077026 A1* | 3/2017 | Okawa | H01L 27/11556 |
| 2017/0077134 A1* | 3/2017 | Taguchi | H01L 27/11582 |
| 2017/0098658 A1* | 4/2017 | Matsuda | H01L 27/11582 |
| 2017/0179026 A1* | 6/2017 | Toyama | H01L 27/11524 |
| 2017/0200676 A1* | 7/2017 | Jeong | H01L 23/5283 |
| 2017/0207232 A1* | 7/2017 | You | H01L 27/11521 |
| 2017/0207238 A1* | 7/2017 | Lee | H01L 23/5226 |
| 2017/0236779 A1* | 8/2017 | Komori | H01L 27/11565 257/326 |
| 2017/0271353 A1* | 9/2017 | Lee | H01L 27/11582 |
| 2017/0271359 A1* | 9/2017 | Sakamoto | H01L 27/11582 |
| 2017/0294388 A1* | 10/2017 | Yoon | H01L 23/562 |
| 2017/0309634 A1* | 10/2017 | Noguchi | H01L 27/11519 |
| 2017/0323900 A1* | 11/2017 | Kanamori | H01L 27/11582 |
| 2017/0352678 A1* | 12/2017 | Lu | H01L 21/4846 |
| 2017/0358593 A1* | 12/2017 | Yu | H01L 27/11582 |
| 2018/0083030 A1* | 3/2018 | Yun | H01L 23/5226 |

FOREIGN PATENT DOCUMENTS

| | | |
|---|---|---|
| KR | 2015-0033932 A | 4/2015 |
| KR | 2015-0057254 A | 5/2015 |
| KR | 2015-0081383 A | 7/2015 |
| KR | 2015-0081393 A | 7/2015 |

* cited by examiner

MEMORY DEVICE

PRIORITY STATEMENT

This application claims benefit of priority to Korean Patent Application No. 10-2016-0091946, filed on Jul. 20, 2016 in the Korean Intellectual Property Office, the disclosure of which is incorporated herein by reference in its entirety.

BACKGROUND

1. Field

The present inventive concept relates to a memory device. In particular, the present inventive concept relates to a 3D memory device, i.e., a memory device having a three-dimensional array of memory cells.

2. Description of the Related Art

Electronic devices are increasingly being required to process large amounts of data while being gradually scaled down. Accordingly, an increase in a degree of integration of semiconductor memory devices used for such electronic devices has been demanded. As one method of increasing a degree of integration of semiconductor memory devices, a memory device having a vertical transistor structure in lieu of a conventional planar transistor structure has been proposed.

SUMMARY

According to an aspect of the present inventive concept, a memory device includes a substrate having an upper surface, a stack of gate electrode layers disposed on the upper surface of a substrate and including unit electrodes and connecting electrodes, and in which each of the gate electrode layers includes a respective group of the unit electrodes, and each of the unit electrodes of the group extends longitudinally in a first direction and the unit electrodes of the group being spaced from each other in a second direction. Also, within each of at least some of the gate electrode layers, a plurality of the connecting electrodes connect the unit electrodes of the gate electrode layer to each other, each of the plurality of the connecting electrodes of the layer are interposed between and connecting adjacent ones of a respective pair of the unit electrodes in the gate electrode layer, and at least one of the plurality of connecting electrodes of the gate electrode layer is offset in the first direction relative to another of the connecting electrodes of the gate electrode layer. The device also includes a plurality of channel structures extending vertically through at least some of the gate electrode layers so as to each extend in a direction perpendicular to the upper surface of the substrate, a plurality of first common source lines each extending horizontally in the first direction, and interposed between the unit electrodes of the gate electrode layers, and a plurality of second common source lines extending horizontally in the first direction, each of the second common source lines being interposed between adjacent ones of the first common source lines, and each of the common source lines having a first section and a second section separated from each other in the first direction by respective ones of the connecting electrodes of the gate electrode layers.

According to another aspect of the present inventive concept, a memory device includes a substrate, a gate structure comprising a stack of gate electrode layers disposed on the substrate and constituting at least one ground select line, a plurality of word lines, and at least one string select line, a plurality of first common source lines extending horizontally in a first direction and dividing the gate structure into a plurality of blocks, and a plurality of second common source lines extending horizontally in the first direction to divide each of the blocks into a plurality of unit areas, each of the second common source lines having a first section and a second section separated from each other in the first direction. Also, the location at which the first section and the second section of each of at least one of the second common source lines are separated from each other is offset in the first direction from the location at which the first section and the second section of another of the second common source lines are separated from each other.

According to still another aspect of the present inventive concept, a memory device includes a gate structure having a plurality of gate electrode layers sequentially stacked on a substrate, each of the gate electrode layers including a plurality of unit electrodes, the gate structure including at least one ground select line, a plurality of word lines, and at least one string select line formed by the gate electrode layers, a plurality of first common source lines extending in a first direction to divide the gate structure into a plurality of blocks, a plurality of second common source lines extending in the first direction, and disposed between the first common source lines to divide the blocks into a plurality of unit areas; and a vertical insulating layer passing through the word lines and the at least one ground select line.

According to yet another aspect of the present inventive concept, a memory device includes a substrate, and a gate structure comprising at least one block of gate electrode layers disposed on the substrate, each of the gate electrode layers of the block including a plurality of unit electrodes, and the unit electrodes of each of the gate electrode layers of the block extending longitudinally in a first direction and arrayed in a second direction. Also, at least some of the gate electrode layers of the block include a connecting structure of conductive elements that connect the unit electrodes of the gate electrode layer, and the connecting structure has a pattern that zigzags in the second direction.

BRIEF DESCRIPTION OF DRAWINGS

The above, and other aspects, features, and advantages of the inventive concept will be more clearly understood from the following detailed description of examples thereof when taken in conjunction with the accompanying drawings, in which:

FIGS. 18 through 36 illustrate a memory device during the course of its manufacture and together illustrate a method of manufacturing the memory device according to an example of the present inventive concept, wherein FIGS. 18, 20, 22, 24, 26, 28, 30, 33 and 35 are plan views, FIGS. 19, 21 and 23 are cross-sectional views take along lines of FIGS. 18, 20 and 22, FIGS. 27, 29 and 31 are cross-sectional views take along lines IV-IV' of FIGS. 26, 28 and 30, FIGS. 34 and 36 are cross-sectional views take along lines of FIGS. 33 and 35, and FIGS. 25 and 32 are perspective views.

DETAILED DESCRIPTION

Hereinafter, examples of the present inventive concept will be described in detail with reference to the attached drawings.

Figure 1:
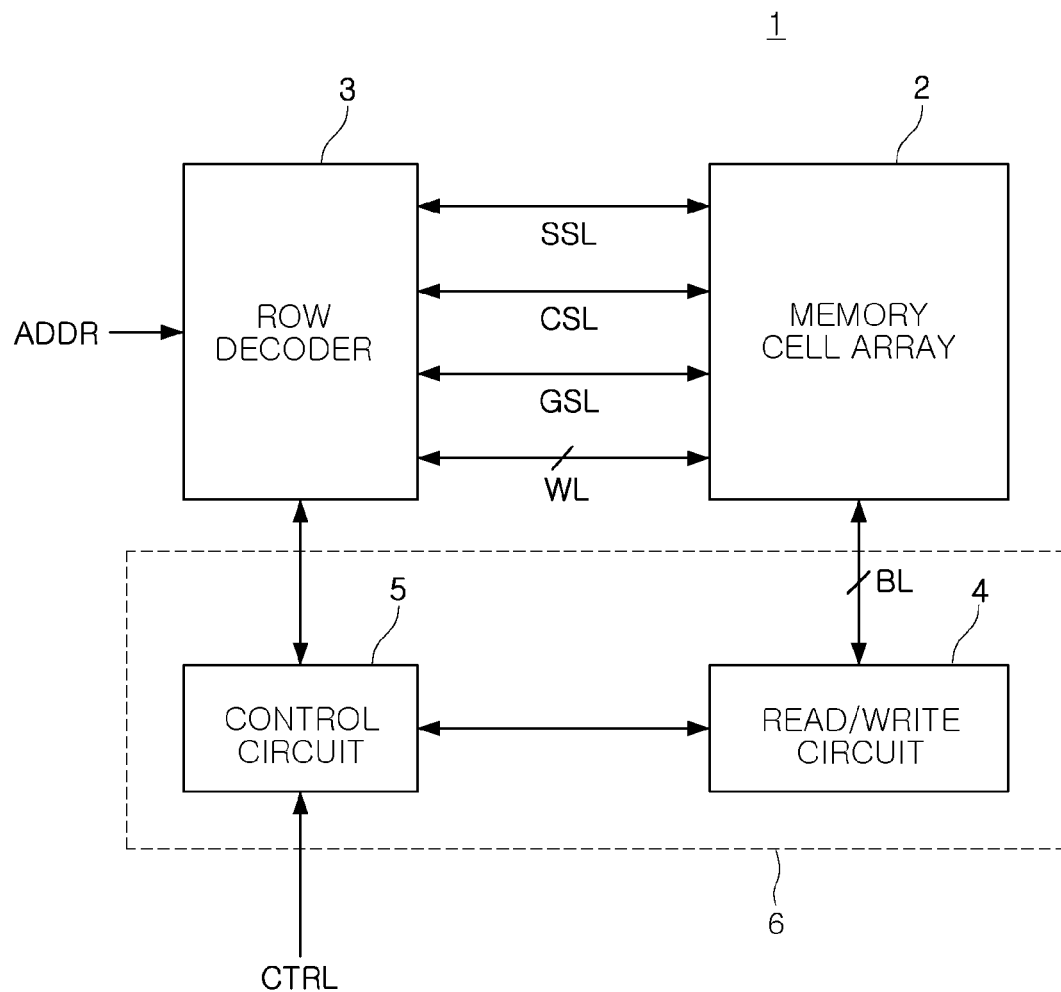
FIG. 1 is a schematic block diagram of a memory device according to an example of the present inventive concept.

Referring to FIG. 1, a memory device 1 according to an example may include a memory cell array 2, a row decoder 3, and a core logic circuit 6. The core logic circuit 6 may include a read/write circuit 4 and a control circuit 5.

The memory cell array 2 may include a plurality of memory cells arranged in a plurality of rows and a plurality of columns. The memory cells of the memory cell array 2 may be connected to the row decoder 3 through a word line WL, a common source line CSL, a string select line SSL, and a ground select line GSL, and may be connected to the read/write circuit 4 through a bit line BL. In an example, a plurality of memory cells arranged in a single row may be connected to a single word line WL, and a plurality of memory cells arranged in a single column may be connected to a single bit line BL.

The memory cells of the memory cell array 2 may be divided into a plurality of memory blocks. Each of the memory blocks may include a plurality of word lines WLs, a plurality of string select lines SSLs, a plurality of ground select lines GSLs, a plurality of bit lines BLs, and at least one common source line CSL.

The row decoder 3 may receive address ADDR information from an external source, and may decode the received ADDR information to determine a level of voltage supplied to at least a portion of the word line WL, the common source line CSL, the string select line SSL, and the ground select line GSL connected to the memory cell array 2.

The read/write circuit 4 may select at least a portion of the bit lines BLs connected to the memory cell array 2 in response to a command received from the control circuit 5. The read/write circuit 4 may read data stored in a memory cell connected to the selected at least a portion of the bit lines BLs, or may write data to the memory cell connected to the selected at least a portion of the bit lines BLs. The read/write circuit 4 may include circuits such as a page buffer, an input/output (I/O) buffer, and a data latch to perform the above operations.

The control circuit 5 may control operations of the row decoder 3 and the read/write circuit 4 in response to a control signal CTRL transmitted from an external source. When data stored in the memory cell array 2 is read, the control circuit 5 may control the row decoder 3 to supply a voltage for a data reading operation to a word line WL in which data is stored. When a voltage for a data reading operation is supplied to a certain word line WL, the control circuit 5 may control the read/write circuit 4 to read data stored in a memory cell connected to the word line WL to which the voltage for a data reading operation is supplied.

When data is written to the memory cell array 2, the control circuit 5 may control the row decoder 3 to supply a voltage for a data writing operation to a word line WL to which data is written. When a voltage for a data writing operation is supplied to a certain word line WL, the control circuit 5 may control the read/write circuit 4 to write data to the memory cell connected to the word line WL to which the voltage for a data writing operation is supplied.

Figure 2:
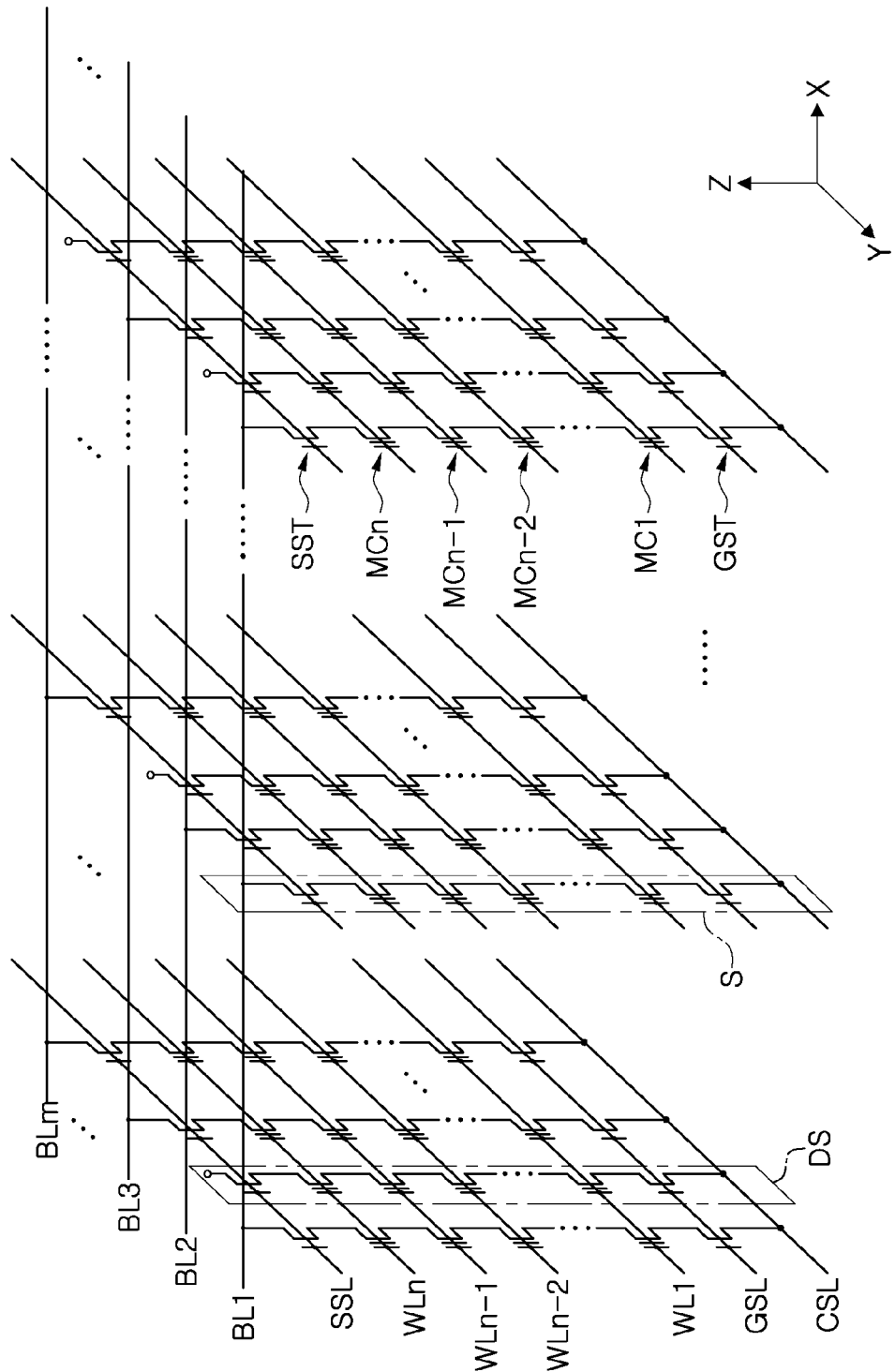
FIG. 2 is a circuit diagram illustrating a memory cell array of a memory device according to an example of the present inventive concept.

FIG. 2 is an equivalent circuit diagram of a memory cell array of a memory device according to an example of the present inventive concept. A memory device according to an example may be provided as a vertical NAND flash element.

Referring to FIG. 2, the memory cell array may include a plurality of memory cell strings S, each including n memory cells MC1 to MCn connected to each other in series, and a ground select transistor GST and a string select transistor SST connected to both ends of the memory cells MC1 to MCn in series. The n memory cells MC1 to MCn connected to each other in series may be connected to n word lines WL1 to WLn for selecting the n memory cells MC1 to MCn, respectively. A dummy cell may also be disposed between the ground select transistor GST and the first memory cell MC1, and between the string select transistor SST and the n-th memory cell MCn.

A gate terminal of the ground select transistor GST may be connected to a ground select line GSL, and a source terminal of the ground select transistor GST may be connected to a common source line CSL. A gate terminal of the string select transistor SST may be connected to a string select line SSL, and a source terminal of the string select transistor SST may be connected to a drain terminal of the n-th memory cell MCn. FIG. 2 illustrates a structure in which a single ground select transistor GST and a single string select transistor SST are connected to the n memory cells MC1 to MCn connected to each other in series. Alternatively, a plurality of ground select transistors GST or a plurality of string select transistors SST may be connected to the n memory cells MC1 to MCn.

A drain terminal of the string select transistor SST may be connected to a plurality of bit lines BL1 to BLm. When a signal is applied to the gate terminal of the string select transistor SST through the string select line SSL, a signal applied through the bit lines BL1 to BLm may be transmitted to the n memory cells MC1 to MCn connected to each other in series, and a data reading/writing operation may thus be performed. Furthermore, a data erase operation of erasing data stored in the n memory cells MC1 to MCn may be performed by applying a certain level of an erase voltage to the n memory cells MC1 to MCn through a well region formed in a substrate.

Referring to FIG. 2, a memory device according to an example may include at least one dummy string DS. The at least one dummy string DS may include a dummy channel electrically separated from the bit lines BL1 to BLm.

Figure 3:
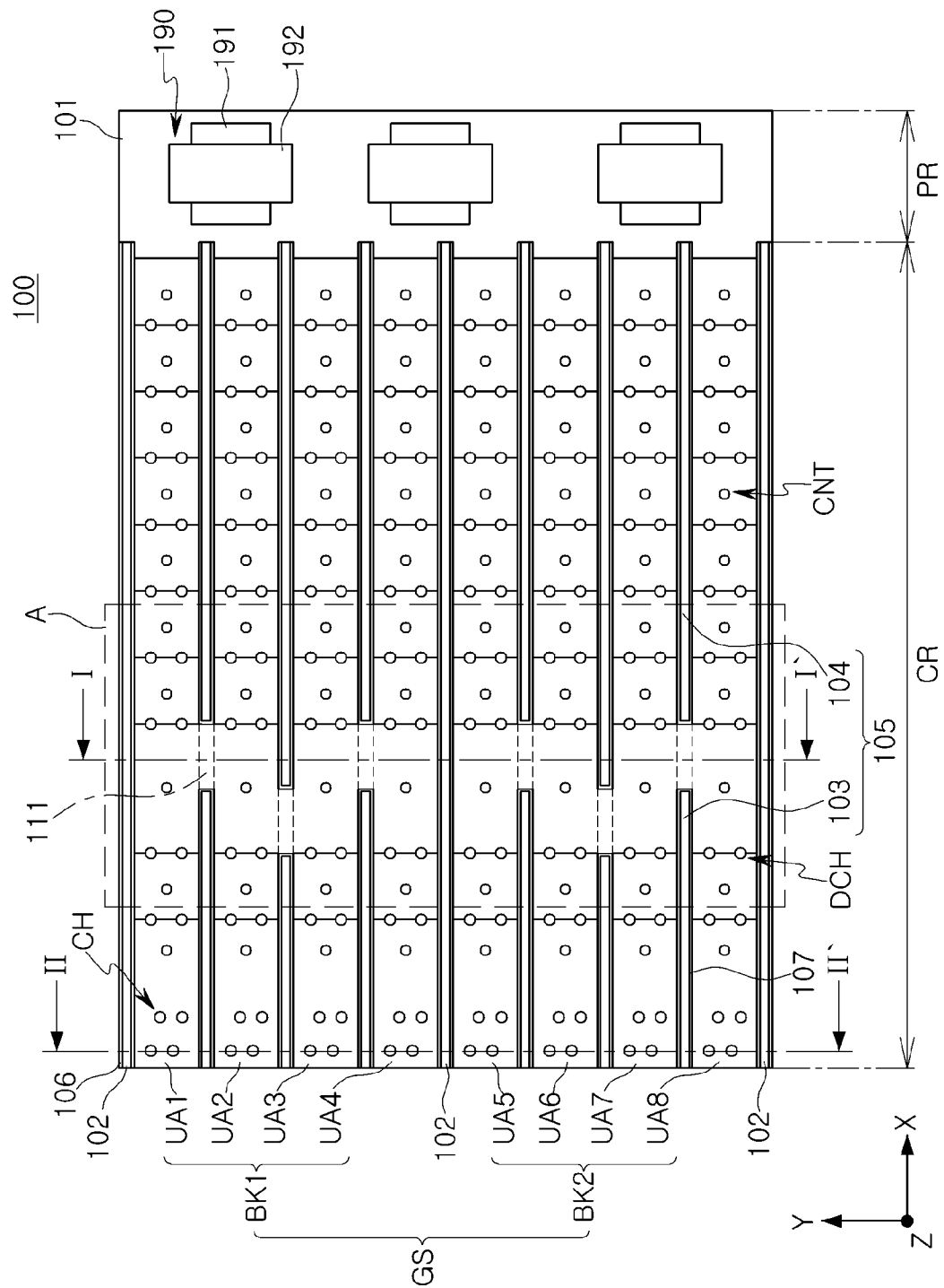
FIG. 3 is a plan view of a memory device according to an example of the present inventive concept.

FIG. 3 is a schematic plan view of a memory device 100 according to an example of the present inventive concept.

Referring to FIG. 3, the memory device 100 according to an example may include a cell region CR and a peripheral circuit region PR. The cell region CR may include a plurality of gate electrode layers, a plurality of cell channel structures CH, a plurality of dummy channel structures DCH, and a plurality of cell contacts CNT, and may further include a plurality of memory cell elements for recording data. The peripheral circuit region PR may include a plurality of circuit elements 190. In an example, each of the circuit elements 190 may be a planar transistor having an active region 191 and a planar gate electrode 192.

The cell region CR may include a gate structure GS divided into a plurality of blocks BK1 and BK2 or a plurality of unit areas UA1 to UA8. In the example illustrated in FIG. 3, a first block BK1 includes first to fourth unit areas UA1 to UA4, and a second block BK2 includes fifth to eighth unit areas UA5 to UA8. However, the inventive concept is not limited to first and second blocks BK1 and BK2 having first to fourth unit areas UA1 to UA4 and the fifth to eighth unit areas UA5 to UA8, respectively. That is, memory devices according to the inventive concept may have gate structures with numbers of blocks and unit areas different than those of the example of FIG. 3.

The gate structure GS may include a plurality of gate electrode layers stacked on a substrate 101. The gate electrode layers may be stacked in a Z-axis direction in the example illustrated in FIG. 3, and a plurality of insulating layers may be disposed between the gate electrode layers to electrically separate the gate electrode layers from each other. The gate electrode layers may provide a string select line, word lines, and a ground select line, and the word lines may provide memory cell elements along with the cell channel structures CH. In an example, the gate electrode layers may provide at least one dummy line between the string select line and the word lines or between the ground select line and the word lines.

The memory device 100 according to an example may include the cell channel structures CH and the dummy channel structures DCH separated from each other in planar fashion. The dummy channel structures DCH may not be electrically connected to a bit line, i.e., may be electrically isolated in the device, as distinguished from the cell channel structures CH. The cell channel structures CH and the dummy channel structures DCH may extend in a direction, for example, the Z-axis direction, perpendicular to an upper surface of the substrate 101, for example, an X-Y plane, to penetrate through the gate electrode layers and a plurality of interlayer insulating layers disposed thereon. The dummy channel structures DCH may be provided to secure stability of the memory device 100 in a manufacturing process thereof, and may be disposed adjacent to an edge of each gate electrode layer as illustrated in FIG. 3.

The gate electrode layers may be divided into a plurality of unit electrodes by a plurality of first and second common source lines 102 and 105 extending in a first direction, e.g., an X-axis direction of FIG. 3. Each of the unit electrodes may be of each of the first to eighth unit areas UA1 to UA8. A portion of the unit electrodes of each of the first to eighth unit areas UA1 to UA8 may be connected to other unit electrodes of other first to eighth unit areas UA1 to UA8 in a single layer. Unit electrodes connected to each other in the single layer may form word lines within each of the first and second block BK1 and BK2. In the example illustrated in FIG. 3, the word lines of the first block BK1 may be formed by connecting a portion of the unit electrodes, of the first to fourth unit areas UA1 to UA4, to each other in the single layer. The connected word lines in each block BK1 or BK2 may have the form of several letters "H" with the horizontal stems of the letters parallel to the second direction, e.g., the Y-axis direction, but at different locations from one another in the first direction (the X-axis direction).

The unit electrodes connected to each other in each layer within each of the first and second blocks BK1 and BK2 may form the word lines. In order to independently control the memory cell devices of the first to eighth unit areas UA1 to UA8, the string select line and the ground select line may be separated from each other between the first to eighth unit areas UA1 to UA8. In an example, portions of the string select line may be separated from each other at boundaries between the first to eighth unit areas UA1 to UA8 by the first common source lines 102 and first lines 103 of the second common source lines 105. Moreover, portions of the ground select line may be separated from each other at the boundaries between the first to eighth unit areas UA1 to UA8 by the first common source lines 102, the second common source lines 105, and isolation insulating layers 111.

In general, the unit electrodes of the first to eighth unit areas UA1 to UA8 to form the word lines may be connected to the cell contacts CNTs, the cell contacts CNTs electrically connected to each other by a wiring on the gate structure GS. In an example, the unit electrodes of the first to eighth unit areas UA1 to UA8 may be connected to each other by connecting electrodes disposed between the first lines 103 and second lines 104 of the second common source lines 105 to thus form the word lines. Thus, a degree of freedom of space design may be improved; therefore, a number of word lines may be increased, and capacity of the memory device 100 and a degree of integration thereof may be increased. A structure of the gate electrode layers of the memory device 100 according to an example will be described below with reference to FIGS. 4 through 10.

In the example illustrated in FIG. 3, at least a portion of the dummy channel structures DCH may be disposed in the connecting electrodes connecting the unit electrodes, of the first to eighth unit areas UA1 to UA8, to each other. The dummy channel structures DCH may be formed in pad regions disposed on upper portions of the connecting electrodes in consideration of process margins. When the dummy channel structures DCH are formed in the pad regions disposed on the connecting electrodes, the pad regions disposed on the connecting electrodes may be connected to two cell contacts CNTs. By forming the dummy channel structures DCH and the two cell contacts CNTs in the pad regions disposed on the connecting electrodes, the word lines may be prevented from collapsing during the manufacturing process and the process margin may be managed more effectively.

Figure 4:
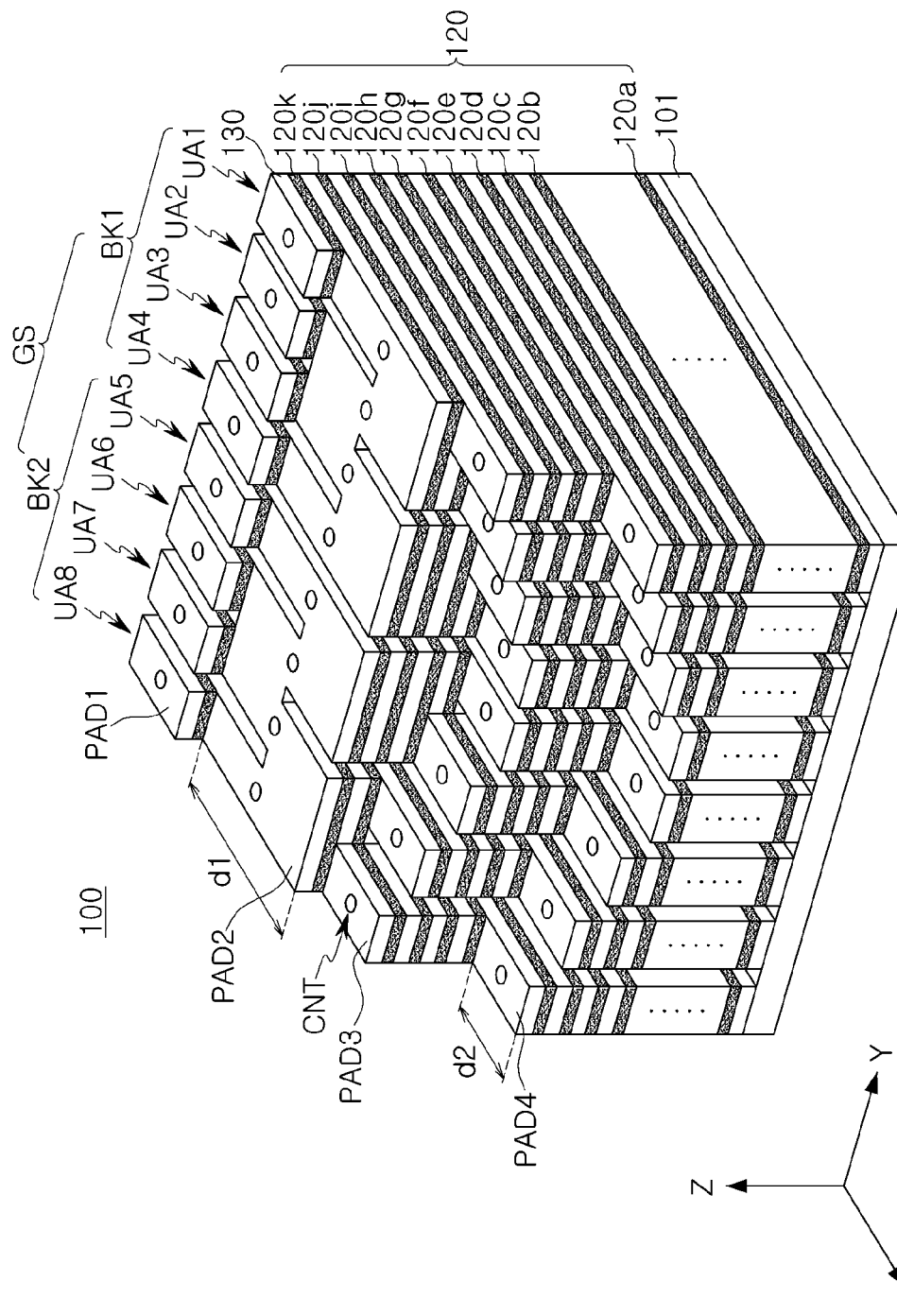
FIG. 4 is a perspective view of region A of the memory device illustrated in FIG. 3.

FIG. 4 is a perspective view illustrating region A of the memory device 100 illustrated in FIG. 3, and FIGS. 5 through 10 are plan views illustrating a portion of gate electrode layers of a memory device according to an example of the present inventive concept.

Referring to FIG. 4, the gate structure GS having a plurality of gate electrode layers 120a to 120k collectively represented by gate electrode layers 120 and a plurality of insulating layers 130 may be formed on the substrate 101. In the gate structure GS, the gate electrode layers 120a to 120k may be alternately stacked with the insulating layers 130 in the Z-axis direction of FIG. 4.

The gate electrode layers 120a to 120k may be paired with the insulating layers 130, and may extend by different lengths in the first direction, e.g., the X-axis direction of FIG. 4, to form a plurality of pad regions constituting a stepped structure. As illustrated in FIG. 4, each of first to fourth pad regions PAD1 to PAD4 may be offset from other first to fourth pad regions PAD1 to PAD4 adjacent thereto in the X-axis direction, and may form a stepped structure therewith.

The gate electrode layers 120 may include at least one ground select line 120a, a plurality of word lines 120b to 120i, and at least one string select line 120k sequentially stacked in a layering direction from the upper surface of the substrate 101. In an example, a dummy line 120*j* is interposed between the at least one string select line 120*k* and the word lines 120*b* to 120*i*. Thus, the dummy line 120*j* or the uppermost layer of the eighth word line 120*i* may be disposed immediately below the at least one string select line 120*k*.

With reference to the example illustrated in FIG. 4, the word lines 120*b* to 120*i* may be provided step-wise in both the first direction, e.g., the X-axis direction, and a second direction, for example, a Y-axis direction. In an example, the third pad regions PAD3 disposed in the same position in the first direction may be provided step-wise in the second direction. Similarly, the fourth pad regions PAD4 disposed in the same position in the first direction may be provided step-wise in the second direction.

Figure 5:
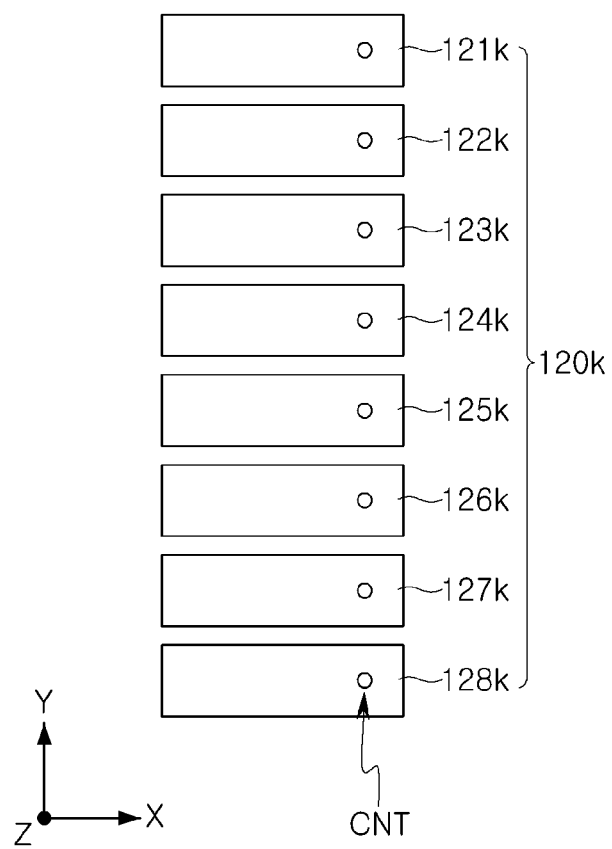
FIGS. 5, 6, 7, 8, 9 and 10 are plan views each illustrating a portion of gate electrode layers of a memory device according to an example of the present inventive concept.

FIGS. 5 through 10 are plan views of the at least one string select line 120*k*, the dummy line 120*j*, and the fifth to eighth word lines 120*f* to 120*i*, respectively. Referring to FIG. 5, the at least one string select line 120*k* may be formed by eight unit electrodes 121*k* to 128*k* separated from each other. Regions in which the eight unit electrodes 121*k* to 128*k* may be separated from each other may be the boundaries between the first to eighth unit areas UA1 to UA8. By separating the eight unit electrodes 121*k* to 128*k* of the at least one string select line 120*k* from each other at the boundaries between the first to eighth unit areas UA1 to UA8, the memory cell elements of each of the first to eighth unit areas UA1 to UA8 may be independently controlled.

Figure 6:
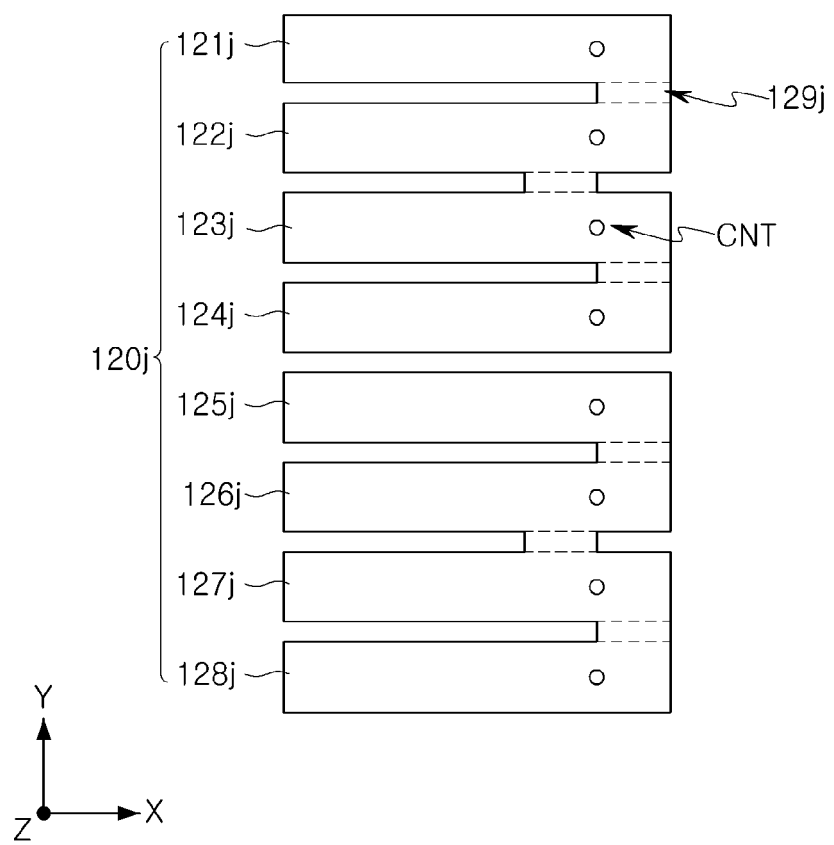

Referring to FIG. 6, a portion of unit electrodes 121*j* to 128*j* forming the dummy line 120*j* may be connected to each other by connecting electrodes 129*j*. The first to fourth unit electrodes 121*j* to 124*j* may be connected to each other, and the fifth to eighth unit electrodes 125*j* to 128*j* may be connected to each other, thus providing different dummy lines. The dummy line formed by the first to fourth unit electrodes 121*j* to 124*j* may be of the first block BK1, and the dummy line formed by the fifth to eighth unit electrodes 125*j* to 128*j* may be of the second block BK2. The dummy lines of each of the first and second blocks BK1 and BK2 may be separated from each other by the first common source line 102 disposed between the first and second blocks BK1 and BK2.

Figure 7:
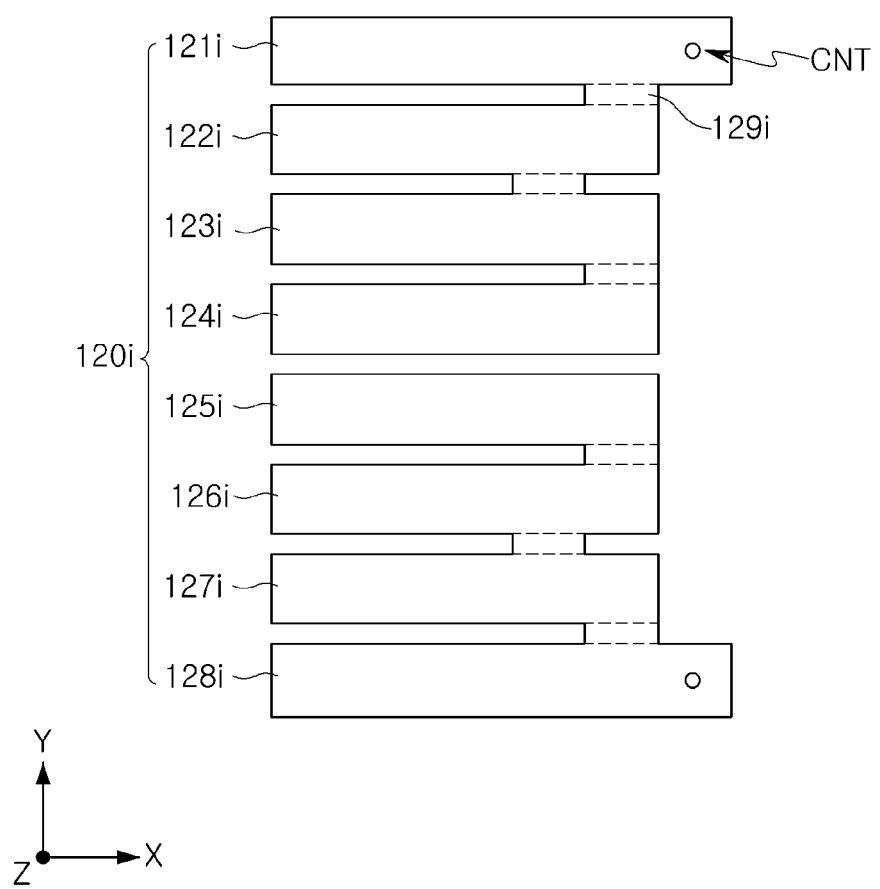

Referring to FIG. 7, a portion of first to eighth unit electrodes 121*i* to 128*i* forming the eighth word line 120*i* may be connected to each other by connecting electrodes 129*i*. The first to eighth unit electrodes 121*i* to 128*i* connected to each other by the connecting electrodes 129*i* may form word lines of each of the first and second blocks BK1 and BK2.

At least a portion of the first to eighth unit electrodes 121*i* to 128*i*, for example, the first and eighth unit electrodes 121*i* and 128*i*, forming the eighth word line 120*i* may extend further than the second to seventh unit electrodes 122*i* to 127*i* in the first direction, e.g., the X-axis direction of FIG. 7. Referring to FIG. 7, the first and eighth unit electrodes 121*i* and 128*i* may extend further than the second to seventh unit electrodes 122*i* to 127*i*, and may be connected to the cell contacts CNT.

A voltage supplied through the cell contact CNT connected to the first unit electrode 121*i* may be transmitted to all of the first to fourth unit electrodes 121*i* to 124*i*, and a voltage supplied through the cell contact CNT connected to the eighth unit electrodes 128*i* may be transmitted to all of the fifth to eighth unit electrodes 125*i* to 128*i*. Thus, without a connection through a wiring, within the gate structure GS, the first to eighth unit electrodes 121*i* to 128*i* disposed in the same layer in the first to eighth unit areas UA1 to UA8 may be connected to each other to form the eighth word line 120*i*. The first and eighth unit electrodes 121*i* and 128*i* and the cell contacts CNT may be connected to each other in the third pad regions PAD3 formed in the first and eighth unit areas UA1 and UA8.

Figure 8:
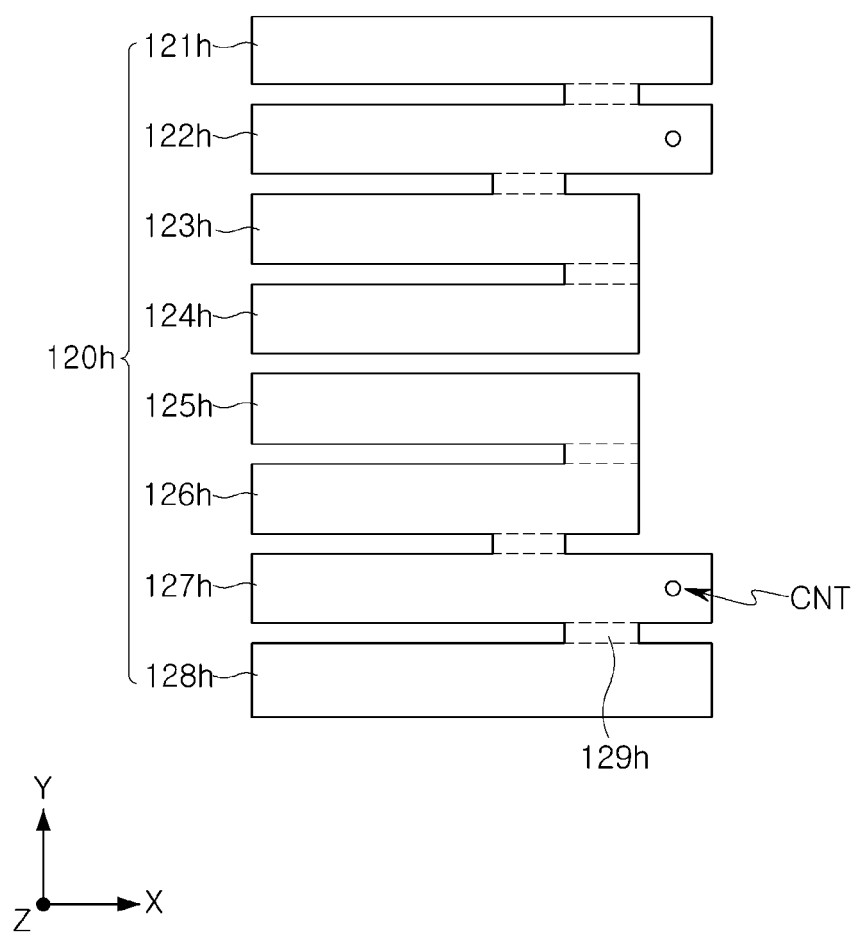

Referring to FIG. 8, first to eighth unit electrodes 121*h* to 128*h* forming the seventh word line 120*h* is illustrated. A portion of the first to eighth unit electrodes 121*h* to 128*h* may be connected to each other by connecting electrodes 129*h*. The first to fourth unit electrodes 121*h* to 124*h* connected to each other by the connecting electrodes 129*h* may be of the first block BK1, and the fifth to eighth unit electrodes 125*h* to 128*h* connected to each other by the connecting electrodes 129*h* may be of the second block BK2.

The first, second, seventh, and eighth unit electrodes 121*h*, 122*h*, 127*h*, and 128*h* may extend further than the third to sixth unit electrodes 123*h* to 126*h* in the first direction, e.g., the X-axis direction. Thus, as illustrated in FIG. 4, the first to eighth word lines 120*b* to 120*i* may be provided step-wise in both of the first direction, e.g., the X-axis direction, and the second direction, e.g., the Y-axis direction. The second and seventh unit electrodes 122*h* and 127*h* may be connected to the cell contacts CNTs, and regions in which the second and seventh unit electrodes 122*h* and 127*h* may be connected to the cell contacts CNT may be the third pad regions PAD3 formed in the second and seventh unit areas UA2 and UA7.

Figure 9:
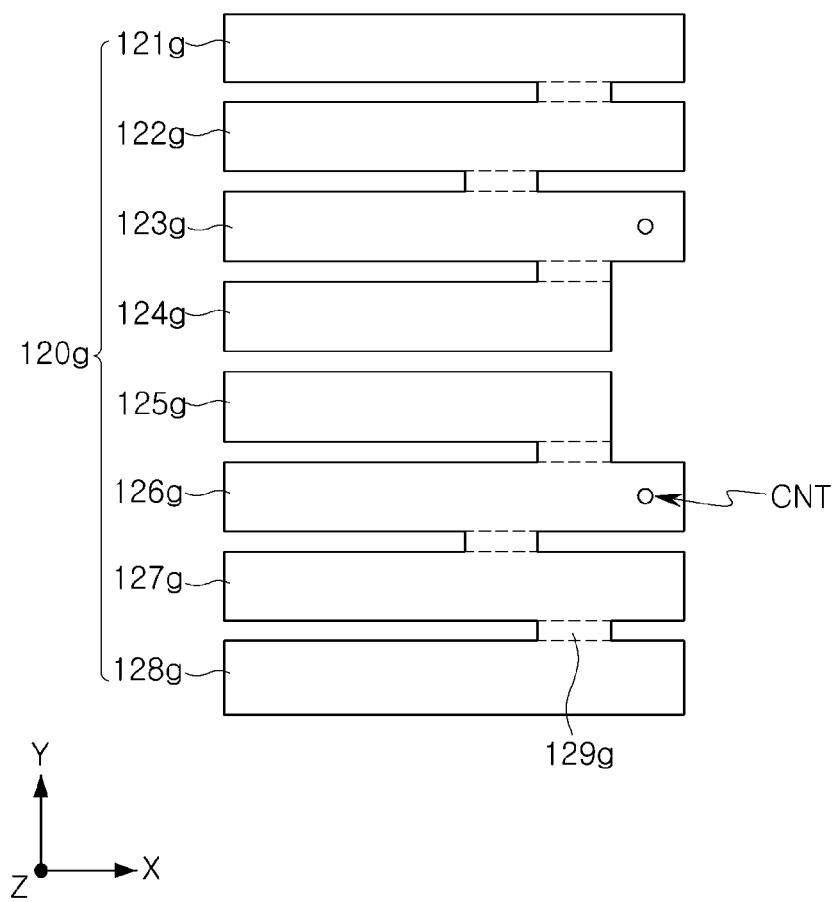

Referring to FIG. 9, the sixth word line 120*g* may be formed by first to eighth unit electrodes 121*g* to 128*g*. The first to fourth unit electrodes 121*g* to 124*g* and the fifth to eighth unit electrodes 125*g* to 128*g* may be connected to each other by connecting electrodes 129*g*, and may form word lines of each of the first and second blocks BK1 and BK2.

The fourth and fifth unit electrodes 124*g* and 125*g* may be shorter than the first to third and sixth to eighth unit electrodes 121*g* to 123*g* and 126*g* to 128*g* in the first direction, e.g., the X-axis direction. The third and sixth unit electrodes 123*g* and 126*g* may be connected to the cell contacts CNTs in the third pad regions PAD3 formed in the third and sixth unit areas UA3 and UA6. A voltage supplied through the cell contacts CNT may be transmitted to the entirety of the word lines of each of the first and second blocks BK1 and BK2 and thus, the memory device 100 may be divided into block units without connecting the first to eighth unit electrodes 121*g* to 128*g* to each other by a wiring.

Figure 10:
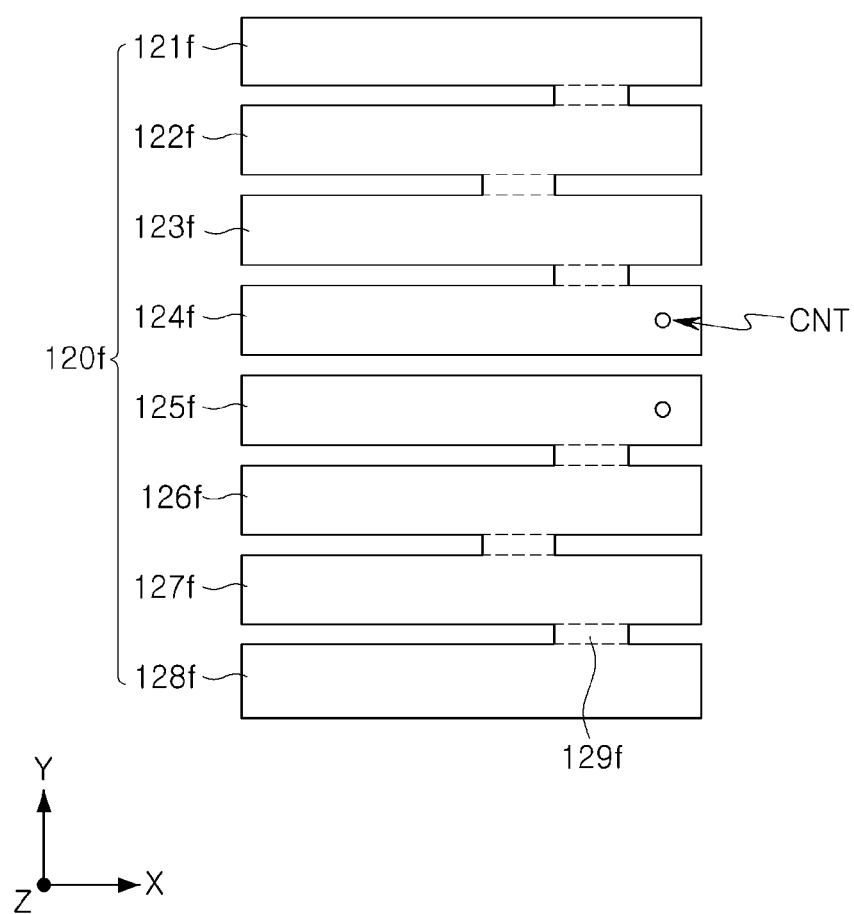

Referring to FIG. 10, the fifth word line 120*f* may be formed of the first and eighth unit electrodes 121*f* and 128*f*, and a portion of the first and eighth unit electrodes 121*f* and 128*f* may be connected to each other by connecting electrodes 129*f*. The fourth and fifth unit electrodes 124*f* and 125*f* may be connected to the cell contacts CNT in the third pad regions PAD3 formed in the fourth and fifth unit areas UA4 and UA5.

The memory device 100 having the structure illustrated in FIG. 4 may be realized by sequentially stacked layers comprising the seventh and eighth word lines 120*f* to 120*i*, the dummy line 120*j*, and the at least one string select line 120*k*. Referring to FIGS. 4 through 10, the connecting electrodes 129*f* to 129*i* of the fifth to eighth word lines 120*f* to 120*i* may be disposed below the second pad regions PAD2 formed by the dummy line 120*j*. Furthermore, the connecting electrodes 129*f* to 129*i* may be disposed in different positions in the first direction, e.g., the X-axis direction, in each gate electrode layer 120 thereof.

In order for portions of the connecting electrodes 129f to 129i to be disposed at different positions in the first direction, the second pad regions PAD2 formed by the dummy line 120j may be relatively wider than the first, third, and fourth pad regions PAD1, PAD3, and PAD4. Here, the first, third, and fourth pad regions PAD1, PAD3, and PAD4 are treads of steps of the gate structure. Referring to FIG. 4, the length d1 of the second pad regions PAD2 in the first direction, e.g., the X-axis direction, may be greater than the length d2 of the first, third, and fourth pad regions PAD1, PAD3, and PAD4 in the first direction. In an example, d1 may be more than about twice d2. Here, the term "more than about twice" describes a dimensional relationship which is specified by design to be more than twice but which may vary slightly from that relationship due to inherent characteristics of the fabricating processes used to manufacture the device. That is the term "more than about twice" may be considered as meaning more than twice within tolerances of the manufacturing process.

By disposing connecting electrodes 129f to 129i at different positions in the first direction in each of their gate electrode layers 120, a defect which may occur in a process of forming the gate electrode layers 120 may be prevented. The process of forming the gate electrode layers 120 may include a process of removing sacrificial layers between the insulating layers 130 and a process of filling spaces, from which the sacrificial layers are removed, with a conductive material. If the connecting electrodes 129f to 129i were all aligned in the first direction, a defect may occur. Specifically, phosphoric acid for removing the sacrificial layers may not effectively flow within the spaces, or the conductive material may not completely fill the spaces and a void may be formed as a result.

According to an aspect of the inventive concept, the above-described defect may be prevented by offsetting the connecting electrodes 129f to 129i from one another in the first direction in their respective gate electrode layer 120. The regions of the connecting electrodes 129f to 129i may have word line cuts formed on both sides thereof during the manufacturing process, and the word line cuts may be inflow passages through which the phosphoric acid and the conductive material may flow. Thus, the connecting electrodes 129f to 129i may have a zigzag form to thus shorten the inflow passages for the phosphoric acid and the conductive material and prevent a defect from occurring in the process of forming the gate electrode layer 120.

In the description above, the term "offset" may be used to describe a case in which the corresponding sides of at least some of the connecting electrodes of a gate electrode layer 120, e.g., the left-hand sides of at least some of the connecting electrodes 129i in FIG. 7, are located at different positions from one another along the first direction (X-axis direction) so as to not all be aligned in the second direction (Y-axis direction). The description that connecting electrodes of a gate electrode layer 120 zigzag can refer to the fact that the geometric centers of the connecting electrodes (refer again to the connecting electrodes 129i as an example) are disposed on opposite sides of a line extending in the second direction (Y-axis direction) in which the unit electrodes, e.g., 125i to 128i joined by the connecting electrodes 129i are arrayed. Or, as described another way, the connecting structure formed by the connecting electrodes, e.g., 129i, of a gate electrode layer 120, have a zigzag pattern. Thus, the path along which the unit electrodes, e.g., 125i to 128i, of a block are joined in the gate electrode layer 120 may zigzag back and forth across a line extending in the direction (Y-axis direction) in which the unit electrodes are arrayed.

Because the connecting electrodes 129f to 129i may be disposed at different positions along the first direction in each of their gate electrode layers 120, separations of the first and second lines 103 and 104 of the second common source lines 105 may be located at different positions. Referring to FIG. 3, a position of the separation between the first and second lines 103 and 104 interposed between the first and second unit areas UA1 and UA2 may be different from a position of the separation between the first and second lines 103 and 104 interposed between the second and third unit areas UA2 and UA3, in the first direction. Thus, the word line cuts provided to form the first and second lines 103 and 104 may allow the inflow passages for the phosphoric acid and the conductive material to be shortened.

Because the portions of each connecting electrode 129f to 129i may be disposed at different positions in the first direction, at least some of the first and second lines 103 and 104 of the second common source lines 105 may have different lengths. Referring to FIG. 3, the first line 103 interposed between the first and second unit areas UA1 and UA2 may be longer than the first line 103 interposed between the second and third unit areas UA2 and UA3. Moreover, the second line 104 interposed between the first and second unit areas UA1 and UA2 may be shorter than the second line 104 interposed between the second and third unit areas UA2 and UA3.

Figure 11:
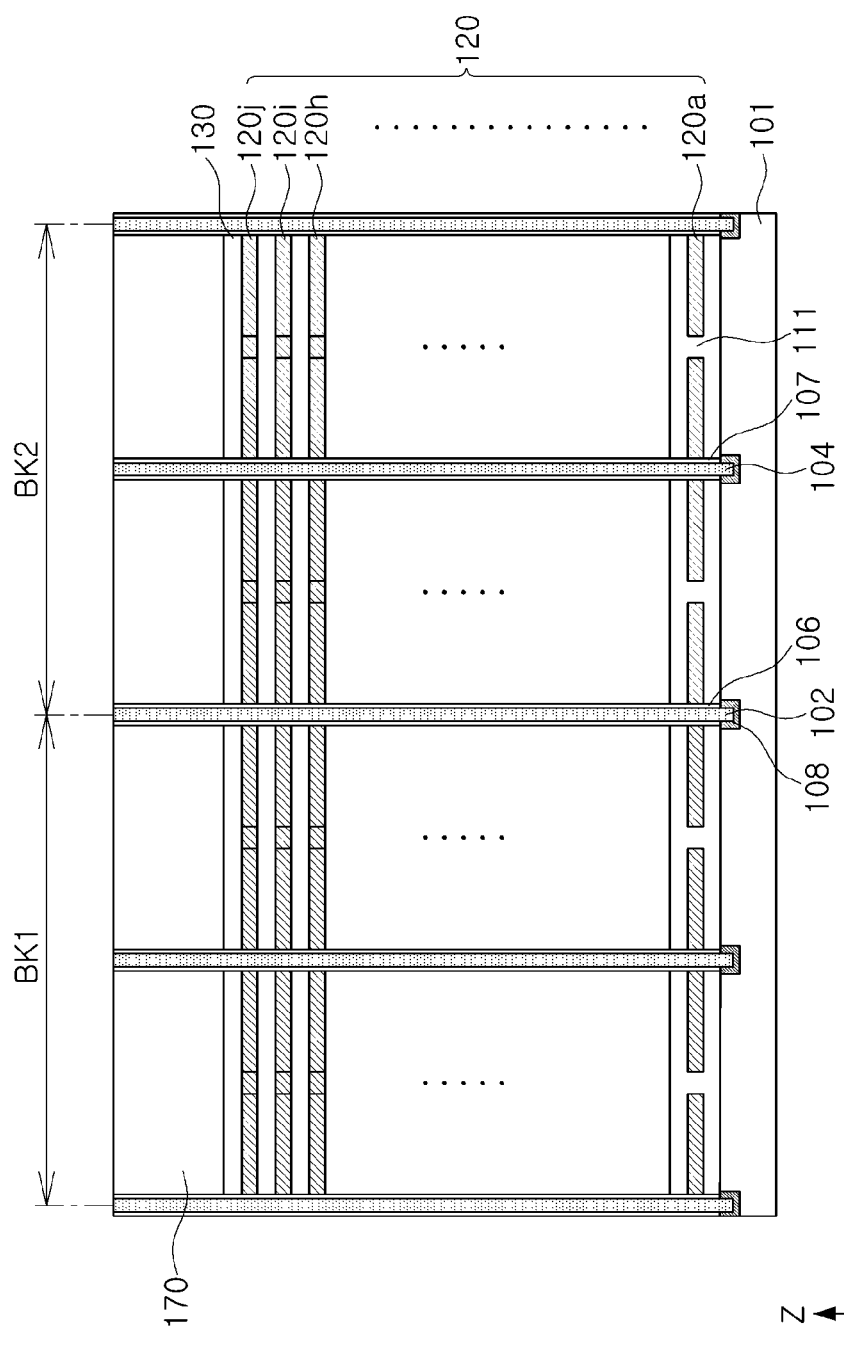
FIG. 11 is a cross-sectional view of the memory device taken along line I-I' of FIG. 3.

FIG. 11 is a cross-sectional view of the memory device 100 taken along line I-I' of FIG. 3. The memory device 100 will hereinafter be described with reference to FIG. 3 for convenience of description.

Referring to FIG. 11, the memory device 100 according to an example may include the substrate 101, and the gate electrode layers 120 and an interlayer insulating layer 170 stacked on the substrate 101. The cross-sectional view in direction I-I' illustrated in FIG. 11 does not illustrate the gate electrode layer 120k forming the string select line.

The gate electrode layers 120 may have the interlayer insulating layer 170 disposed thereon. The interlayer insulating layer 170 may include an insulating material such as a silicon oxide or a silicon nitride, and in examples, may be a high density plasma (HDP) oxide layer or a tetra-ethyl-ortho-silicate (TEOS) oxide layer.

The gate electrode layers 120 and the interlayer insulating layer 170 may be divided into the first and second blocks BK1 and BK2 by the first common source lines 102 extending in the first direction, e.g., the X-axis direction. The first and second blocks BK1 and BK2 may be divided into the first and eighth unit areas UA1 and UA8 by the second common source lines 105. In FIG. 11, only the second lines 104 of a portion of the second common source lines 105 are illustrated.

The gate electrode layer 120a forming the ground select line may be divided by the isolation insulating layer 111. The isolation insulating layer 111 may be disposed below the connecting electrodes 129b to 129i connecting the unit electrodes of the gate electrode layers 120, forming the word lines, to each other. The ground select lines of the respective first to eighth unit areas UA1 to UA8 may be electrically separated from each other by the first and second lines 103 and 104 of the second common source lines 105 and the isolation insulating layer 111 disposed between the first and second lines 103 and 104. Thus, the memory cells of the respective first to eighth unit areas UA1 to UA8 may be independently controlled.

The first and second common source lines 102 and 105 may be connected to source regions 108 of the substrate 101 therebelow. The source regions 108 may be formed by injecting an impurity having a certain conductivity type into the substrate 101, and in an example, may be doped with an N-type impurity. The source regions 108 may extend in the first direction similarly to the first and second common source lines 102 and 105.

Figure 12:
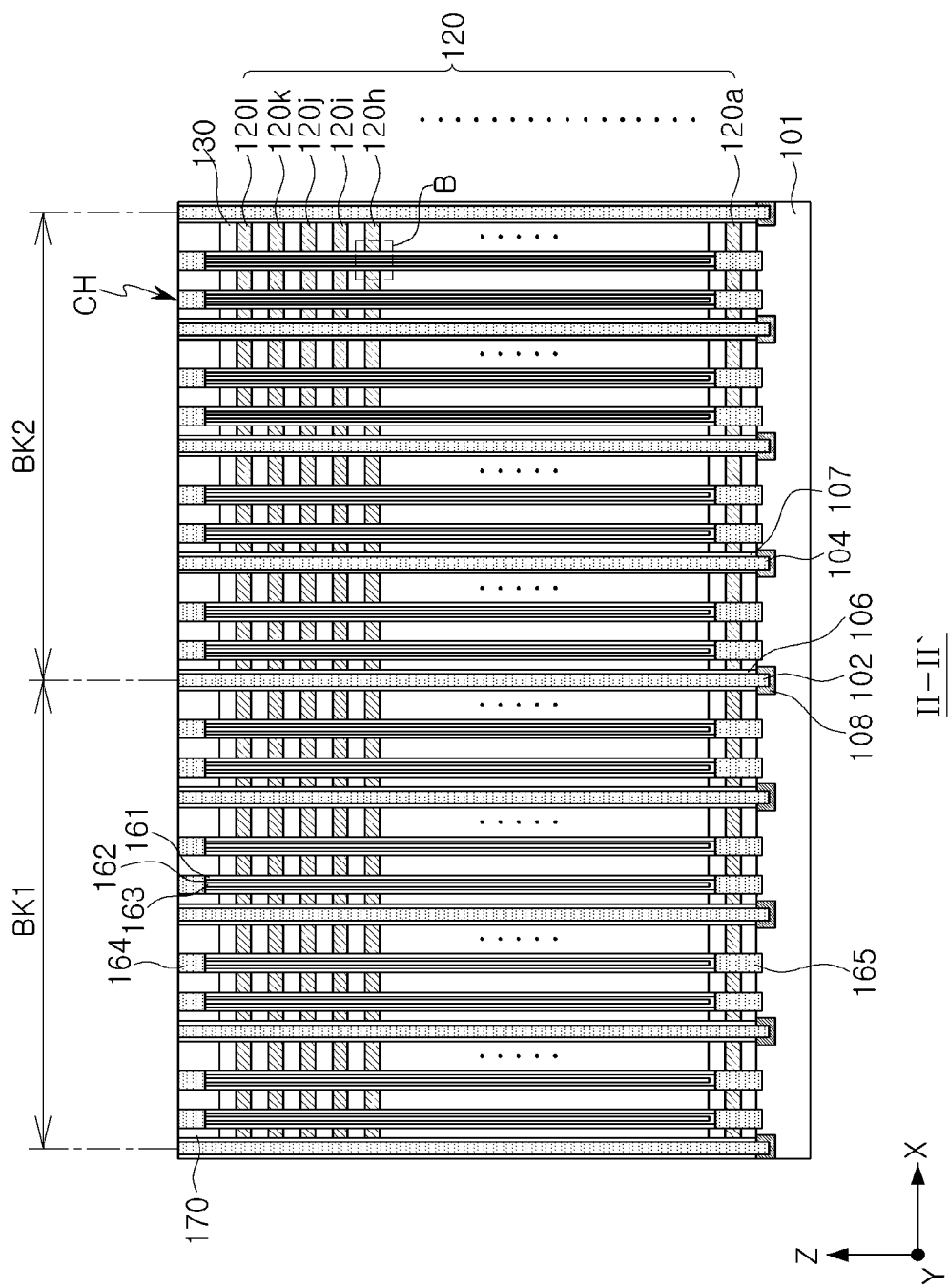
FIG. 12 is a cross-sectional view of the memory device taken along line II-II' of FIG. 3.

FIG. 12 is a cross-sectional view of the memory device 100 taken along line II-If of FIG. 3.

Referring to FIG. 12, the cell channel structures CH may extend to the substrate 101 through the interlayer insulating layer 170 and the gate electrode layers 120a to 120l collectively represented by the gate electrode layer 120. Each of the cell channel structures CH may include a gate insulating layer 161, a channel layer 162, an embedded insulating layer 163, a bit line pad 164, and an epitaxial layer 165. The cell channel structures CH will hereinafter be described with reference to FIG. 13. The dummy channel structures DCH may have a structure similar to that of the cell channel structures CH.

Figure 13:
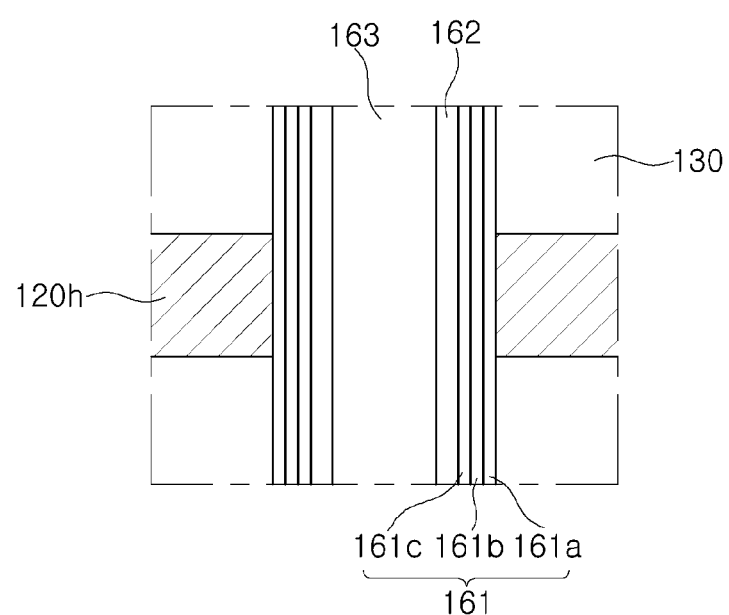
FIG. 13 is an enlarged view of region B of the memory device illustrated in FIG. 12.

FIG. 13 is an enlarged view of region B of the memory device 100 illustrated in FIG. 12.

Referring to FIG. 13, the gate insulating layer 161 may include a blocking layer 161a, a charge storage layer 161b, and a tunneling layer 161c sequentially disposed in a direction toward the channel layer 162.

The channel layer 162 may include a semiconductor material such as polycrystalline silicon. In the examples illustrated in FIGS. 12 and 13, the channel layer 162 may be illustrated as having an annular shape with an internal space. Alternatively, the channel layer 162 may not have an internal space. In this case, the embedded insulating layer 163 may be omitted. In FIGS. 12 and 13, all of the gate insulating layers 161 may be illustrated as surrounding the outer surfaces of the channel layers 162. As an alternative, a portion of the gate insulating layers 161 may surround each of the gate electrode layers 120a to 120k.

Figure 14:
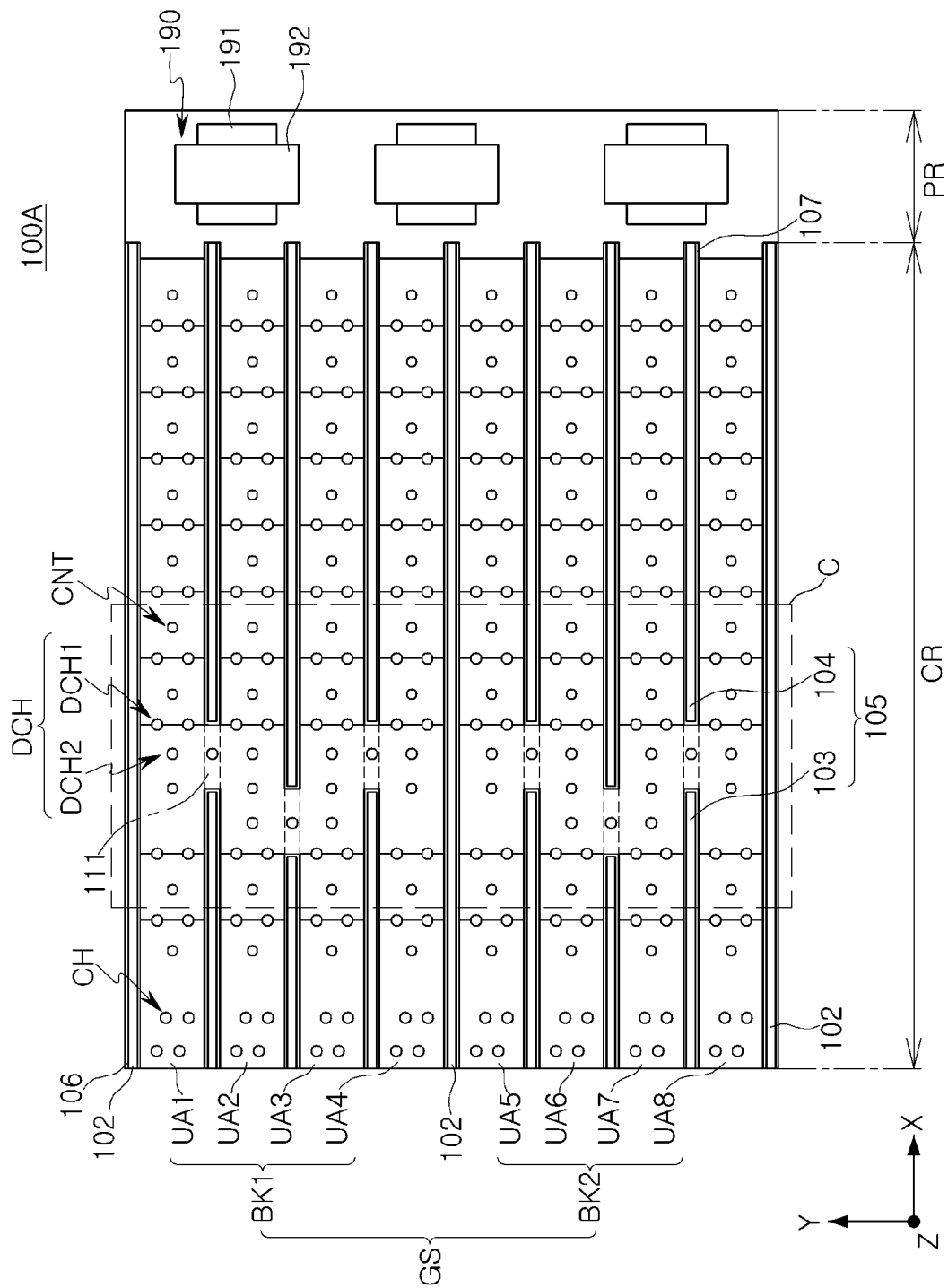
FIG. 14 is a plan view of a memory device according to an example of the present inventive concept.

FIG. 14 is a plan view of a memory device 100A according to another example of the present inventive concept.

The memory device 100A according to the example illustrated in FIG. 14 may include first dummy channel structures DCH1 and second dummy channel structures DCH2. The first dummy channel structures DCH1 may be disposed adjacent to edges of a plurality of gate electrode layers. The second dummy channel structures DCH2 may extend through a plurality of connecting electrodes disposed between first and second lines 103 and 104 of second common source lines 105, or may be disposed adjacent to the connecting electrodes.

The second dummy channel structures DCH2 may serve to shorten inflow passages of phosphoric acid and a conductive material that are required to flow therethrough in a process of forming the gate electrode layers. Thus, degradation of the characteristics of the memory device 100A due to a void formed within the gate electrode layers in the process of forming the gate electrode layer may be prevented.

Figure 15:
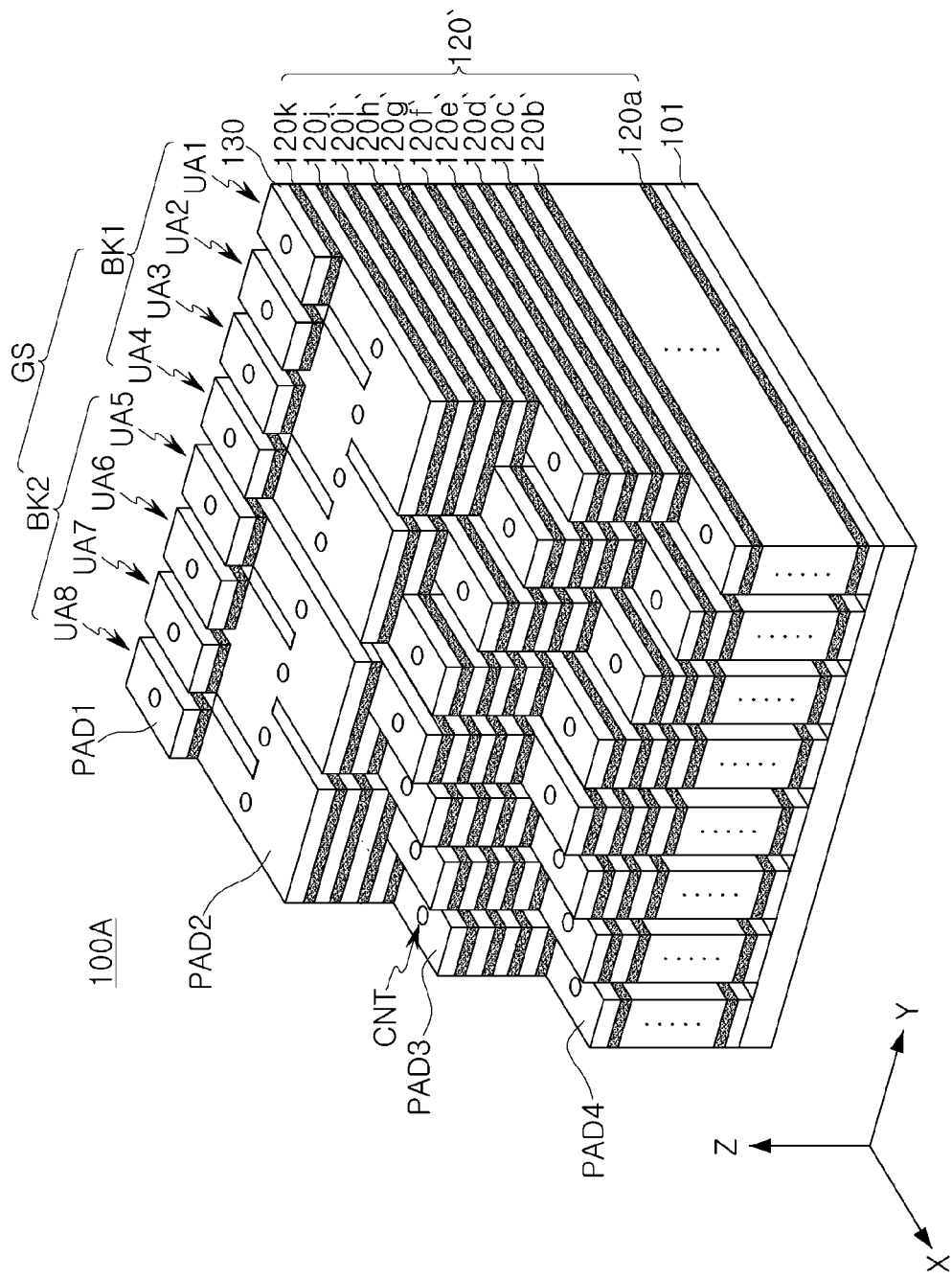
FIG. 15 is a perspective view of region C of the memory device illustrated in FIG. 14.

FIG. 15 is a perspective view of region C of the memory device 100A illustrated in FIG. 14.

Referring to FIG. 15, gate electrode layers 120' of the memory device 100A according to this example may have stepped portions in first and second directions, for example, X- and Y-axis directions. In this example, upper surfaces of third pad regions PAD3 in fourth and fifth unit areas UA4 and UA5 may be higher than those of third pad regions PAD3 in first to third and sixth to eighth unit areas UA1 to UA3 and UA6 to UA8. Fourth pad regions PAD4 may have a structure similar to that of the third pad regions PAD3. The directions in which the steps of the stepped portions of the gate electrode layers 120' ascend and descend may effected by appropriate sequencing and structuring of mask layers used in a process of forming first and second pad regions PAD1 and PAD2 and the third and fourth pad regions PAD3 and PAD4.

Figure 16:
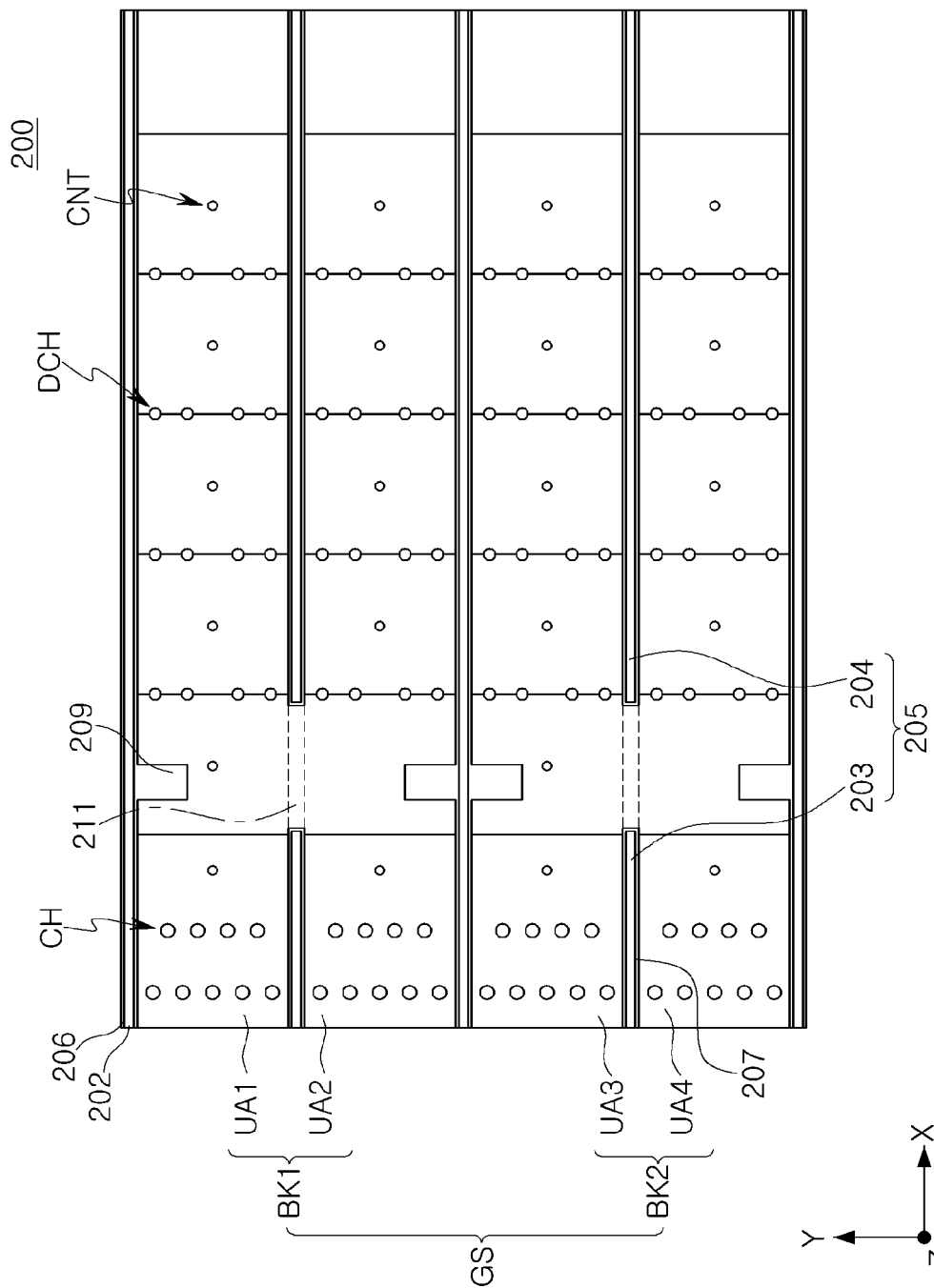
FIGS. 16 and 17 are plan views of memory devices according to examples of the present inventive concept.
Figure 17:
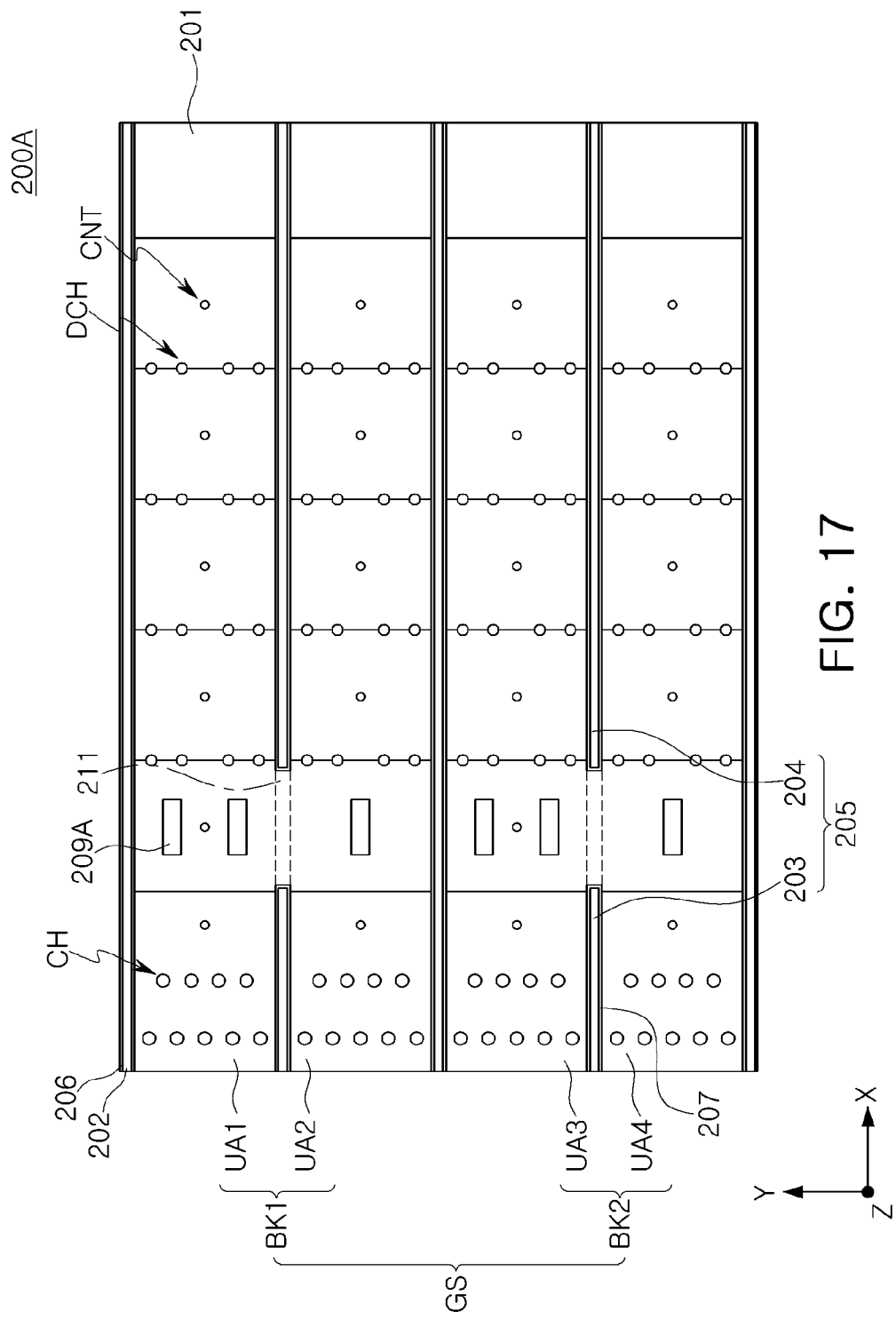

FIGS. 16 and 17 are plan views of memory devices 200 and 200A according to other examples of the present inventive concept.

Referring to FIG. 16, the memory device 200 according to an example may include first to fourth unit areas UA1 to UA4 and first and second blocks BK1 and BK2. Second common source lines 205 may be disposed within the first and second blocks BK1 and BK2, respectively, and thus, connecting electrodes connecting the unit electrodes forming the word lines maybe formed at the same positions in the first direction (the X-axis direction) within each of the first and second blocks BK1 and BK2, respectively.

In order to address a problem that may occur in forming gate electrode layers, the memory device 200 according to the example illustrated in FIG. 16 may have vertical insulating layers 209 formed within the first to fourth unit areas UA1 to UA4, respectively. The gate electrode layer may be formed by forming opening regions corresponding to the vertical insulating layers 209 and then allowing phosphoric acid and a conductive material to flow through the opening regions. The opening regions corresponding to the vertical insulating layers 209 may be used as inflow passages of the phosphoric acid and the conductive material along with word line cuts corresponding to first common source lines 202 and the second common source line 205. The opening regions corresponding to the vertical insulating layers 209 may diversify the inflow passages of the phosphoric acid and the conductive material, thus reducing the number of defects which may occur in forming the gate electrode layer.

Referring to FIG. 16, the vertical insulating layers 209 may be regions extending from the first common source lines 202. In the memory device 200A according to the example illustrated in FIG. 17, vertical insulating layers 209A may be spaced from first and second common source lines 202 and 205. The vertical insulating layers 209 and 209A may be disposed adjacent to the connecting electrodes connecting the unit electrodes forming the word lines in the first to fourth unit areas UA1 to UA4. Because the inflow passages of the phosphoric acid and the conductive material would be longer in a region adjacent to the connecting electrodes, the vertical insulating layers 209 and 209A are formed to thus shorten the inflow passages of the phosphoric acid and the conductive material.

FIGS. 18 through 36 are views illustrating a method of manufacturing a memory device according to an example of the present inventive concept.

Figure 18:
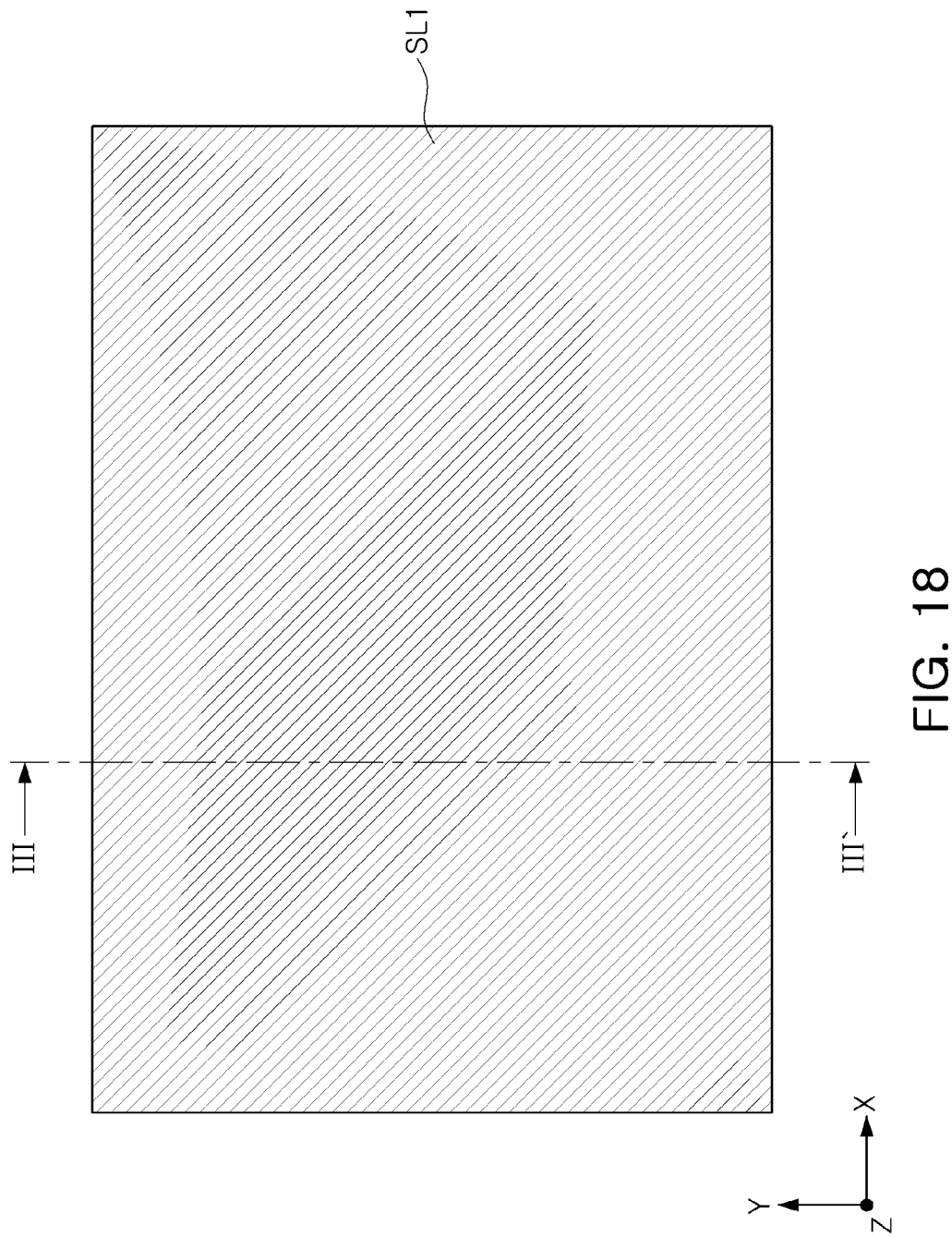
Figure 19:
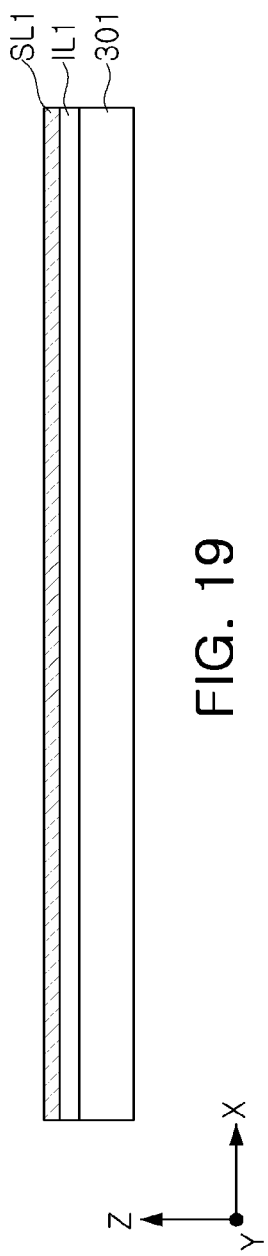

FIG. 19 is a view of a cross-sectional view taken along line of FIG. 18. Referring to FIGS. 18 and 19, a first insulating layer IL1 and a first sacrificial layer SL1 may be formed on a first substrate 301. Each of the first insulating layer IL1 and the first sacrificial layer SL1 may include a material having a predetermined etch selectivity. In an example, the first insulating layer IL1 may include a silicon oxide, and the first sacrificial layer SL1 may include a silicon nitride.

Figure 20:
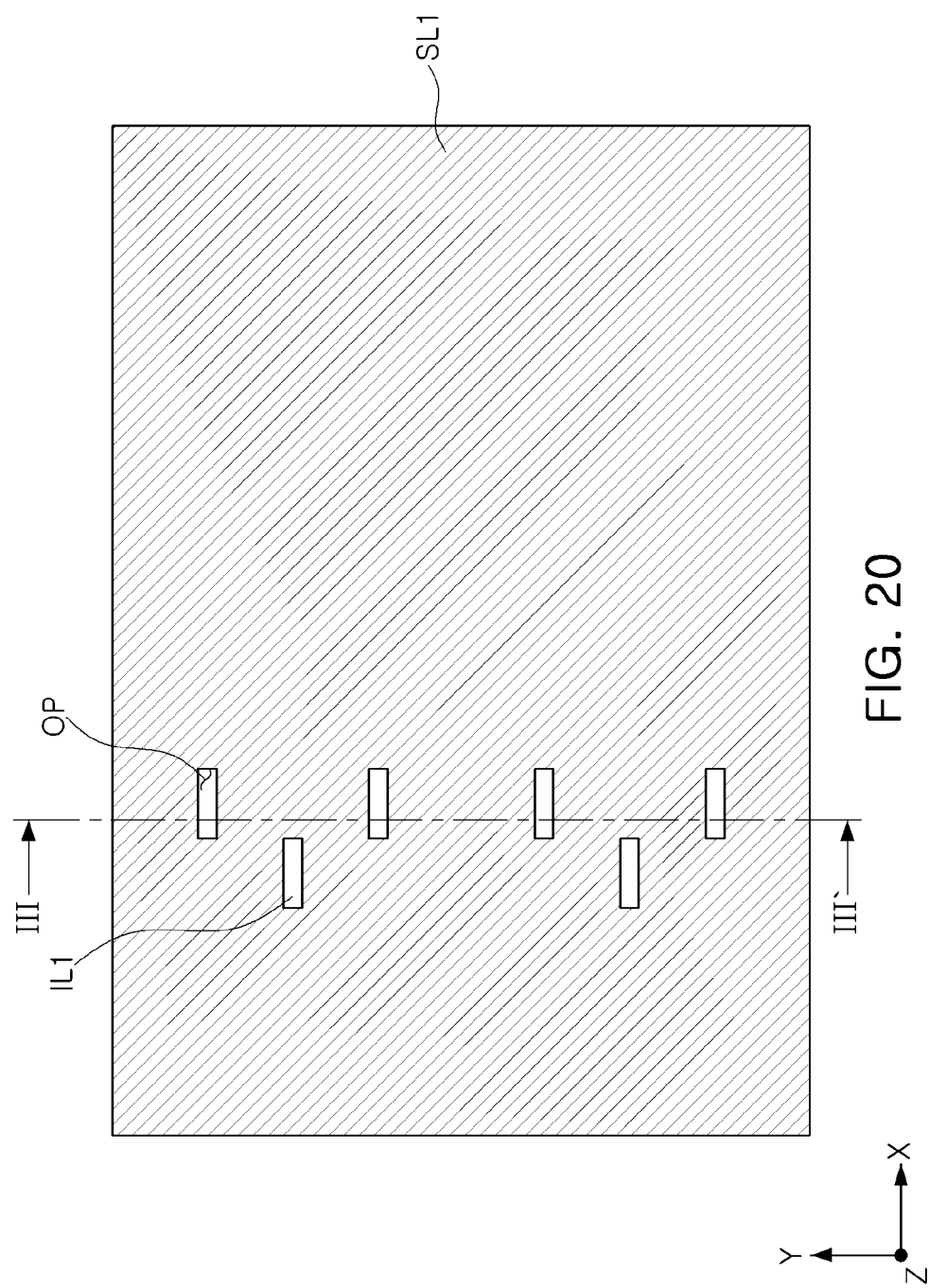
Figure 21:
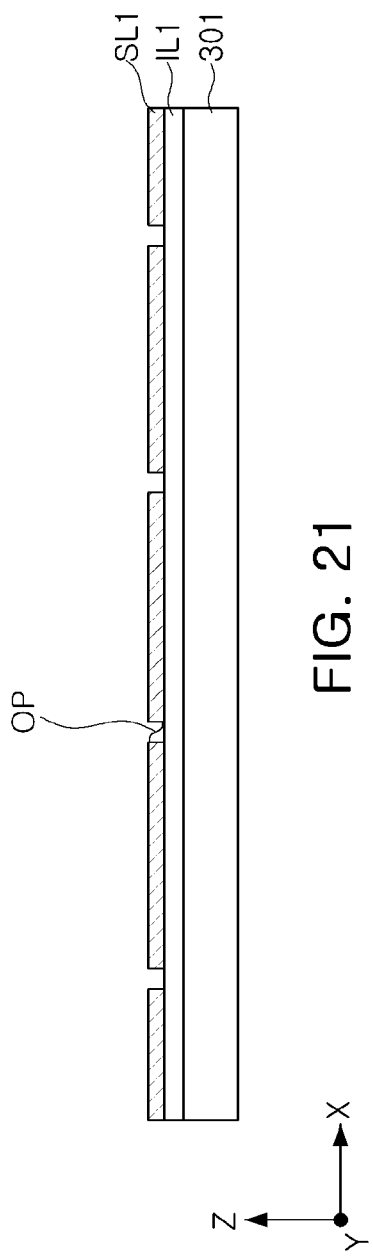

Referring to FIGS. 20 and 21, a plurality of opening regions OP may be formed in the first sacrificial layer SL1. Portions of the first insulating layer IL1 may be exposed through the opening regions OP. At least a portion of the opening regions OP may be formed in different positions in a first direction, for example, an X-axis direction.

Figure 22:
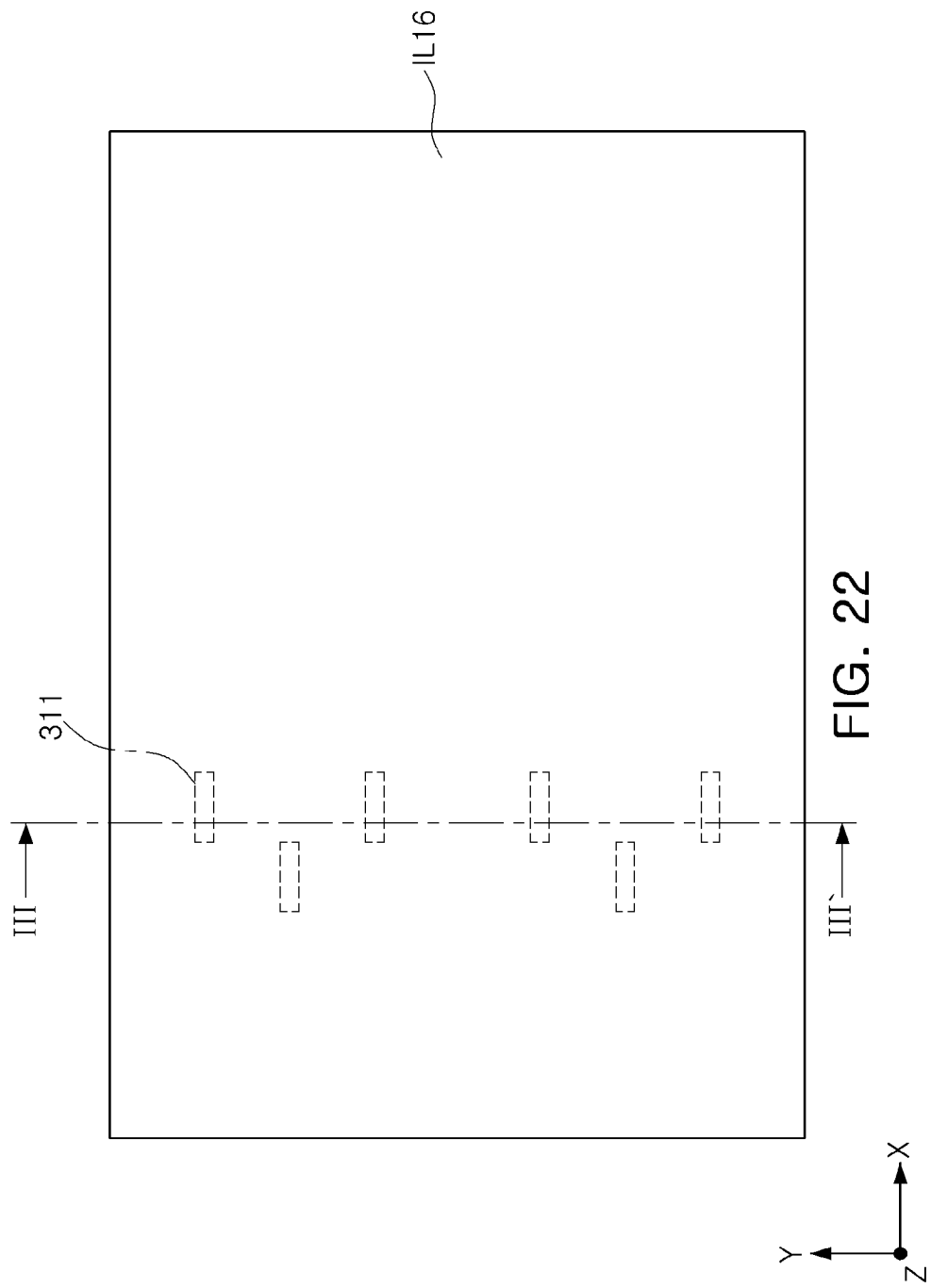
Figure 23:
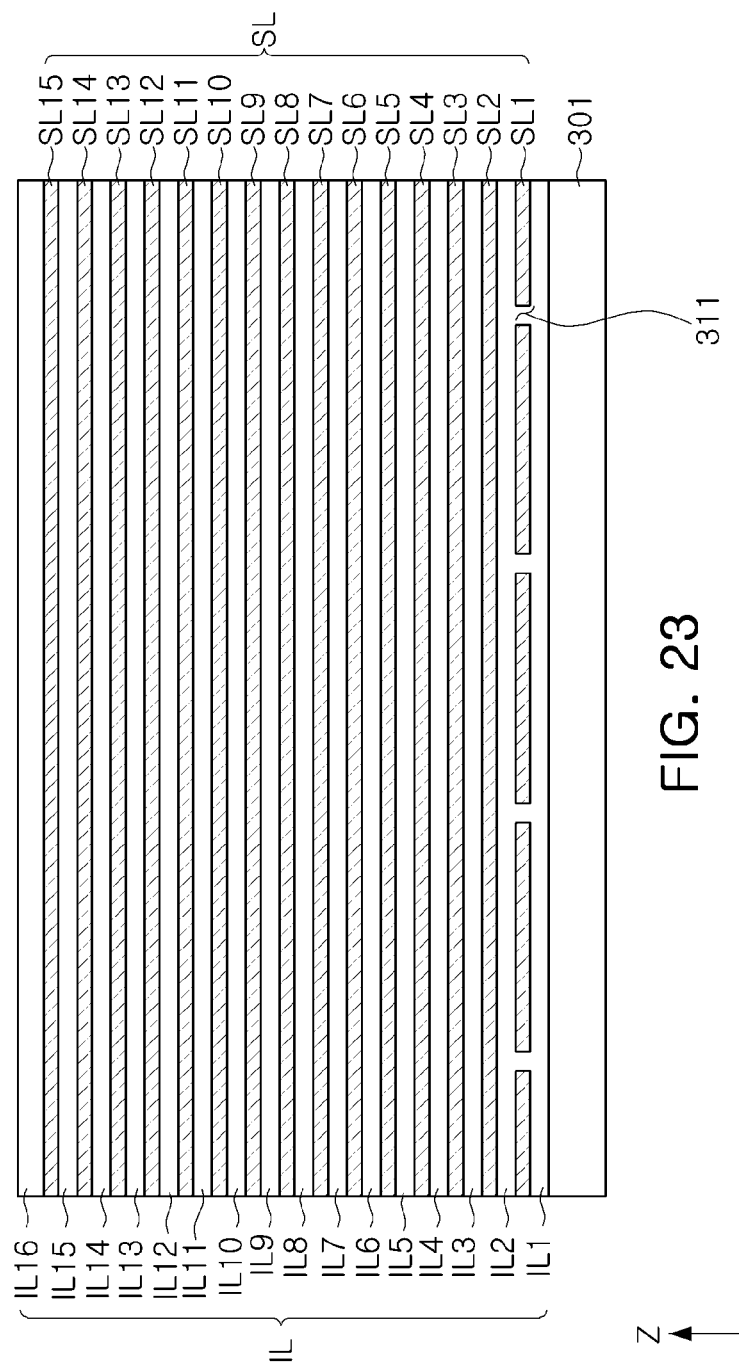

Referring to FIGS. 22 and 23, second to fifteenth sacrificial layers SL2 to SL15 and second to sixteenth insulating layers IL2 to IL16 may further be formed on the first sacrificial layer SL1. Each of the first to fifteenth sacrificial layers SL1 to SL15 collectively represented by sacrificial layers SL and the first to sixteenth insulating layers IL1 to IL16 collectively represented by insulating layers IL, may include a material having a predetermined etch selectivity. The numbers of the sacrificial layers SL and the insulating layers IL may vary from those illustrated depending on the number of gate electrode layers to be formed in a memory device. The opening regions OP formed in the first sacrificial layer SL1 may be filled with an insulating material. Thus, isolation regions 311 may be formed.

Figure 24:
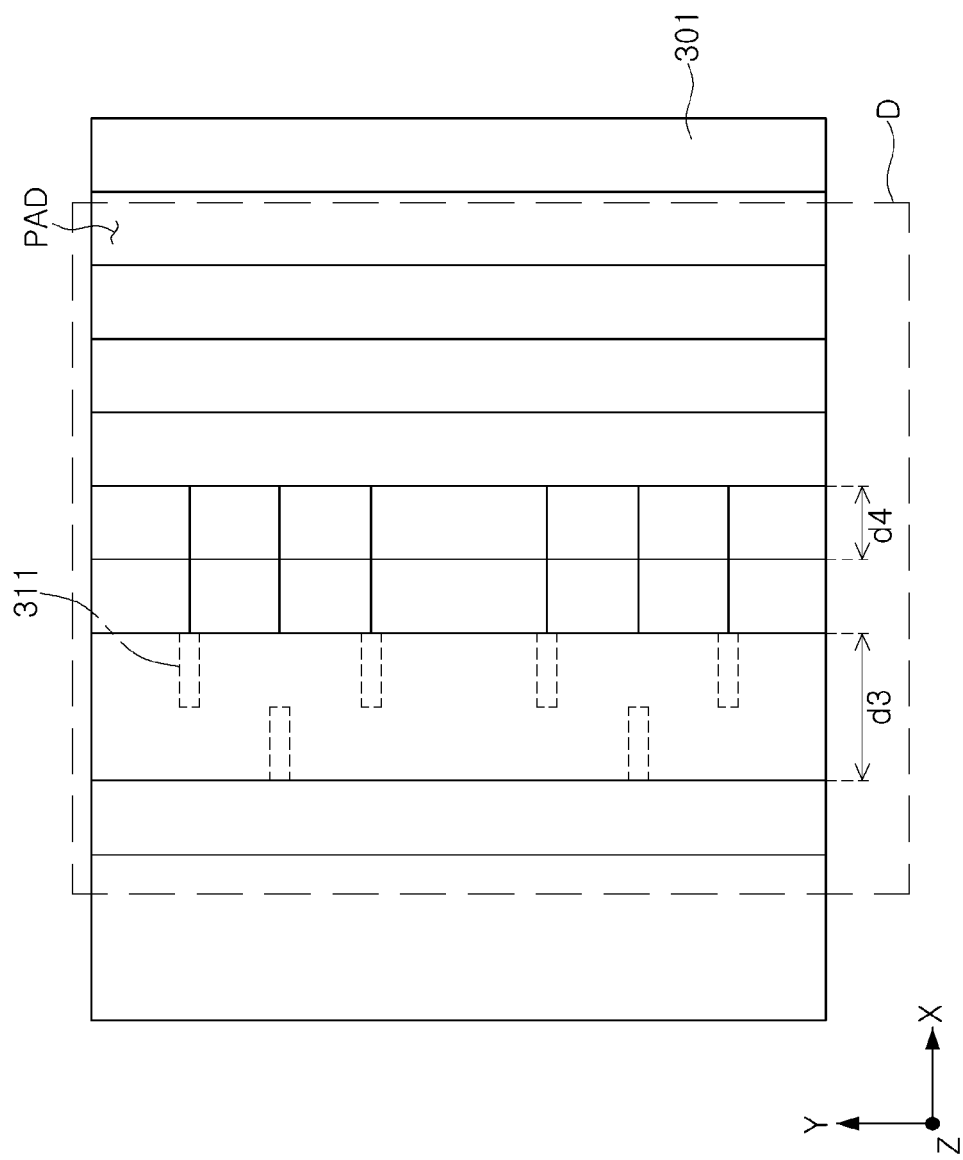
Figure 25:
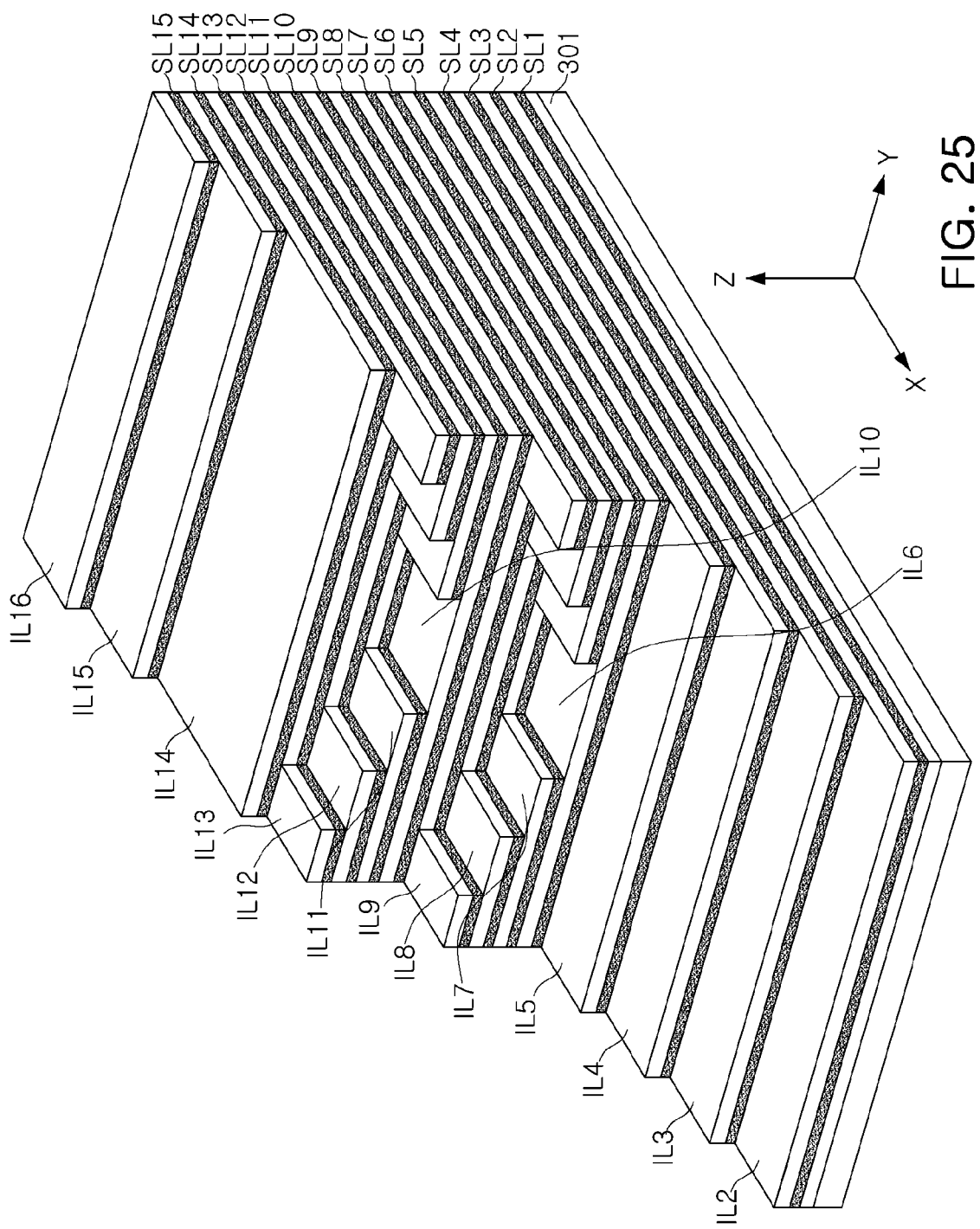

Referring to FIGS. 24 and 25, pad regions PAD may be formed by etching the sacrificial layer SL and the insulating layer IL. FIG. 25 is a perspective view of region D of FIG. 24. Referring to FIG. 25, the sacrificial layers SL and the insulating layers IL adjacent to each other in a stack direction, e.g., a Z-axis direction, may extend by the same length in the first direction, e.g., the X-axis direction, while being paired with each other. Each pair of the sacrificial layers SL and the insulating layers IL may have different lengths to form the pad region PAD, as illustrated in FIG. 25.

The pad region exposing an upper surface of the insulating layer IL14 may extend further than other pad regions in the first direction. Referring to FIGS. 24 and 25, the length d3 of the pad region exposing the upper surface of the insulating layer IL14 may be greater than the length d4 of the other pad regions in the first direction. In an example, d3 may be more than about twice d4.

Figure 26:
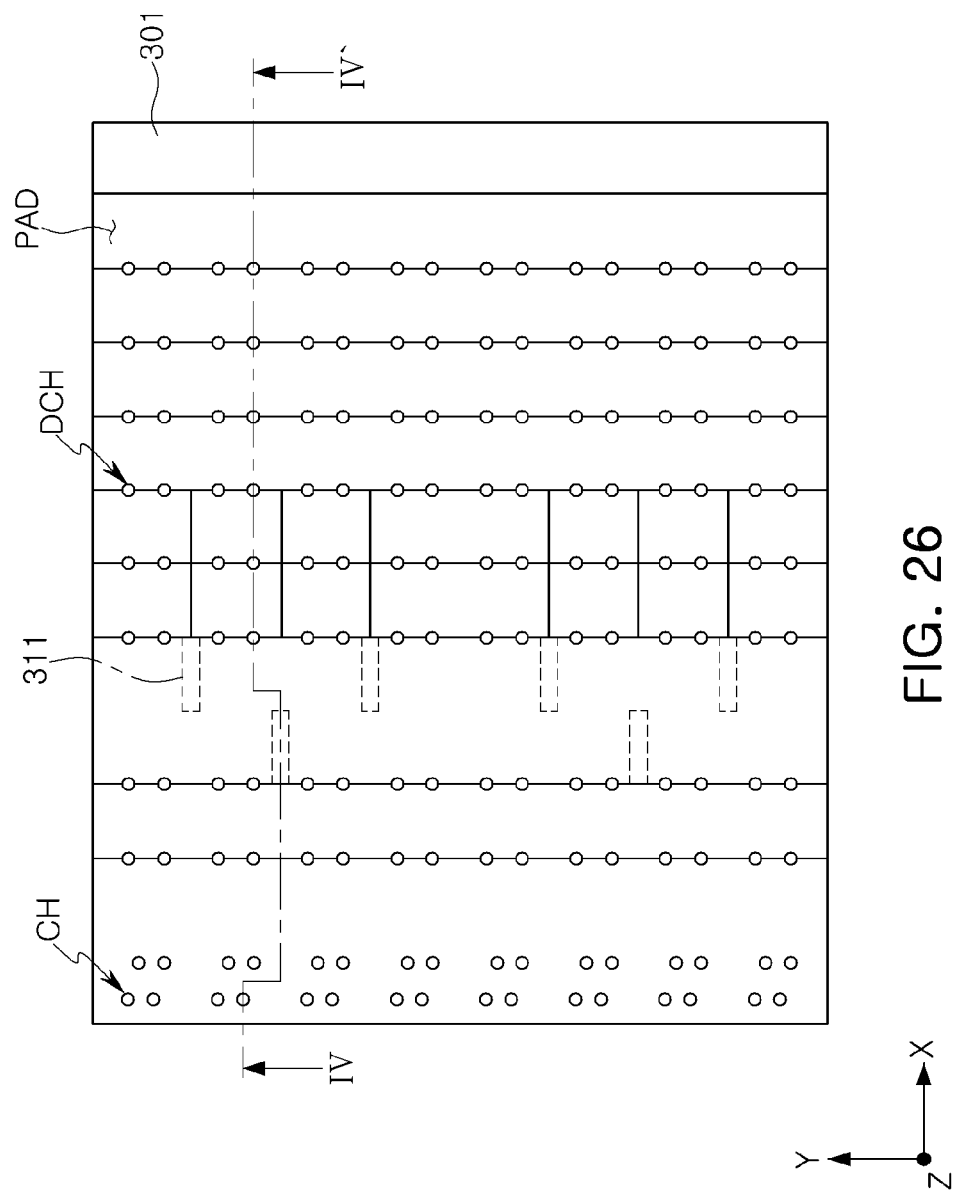
Figure 27:
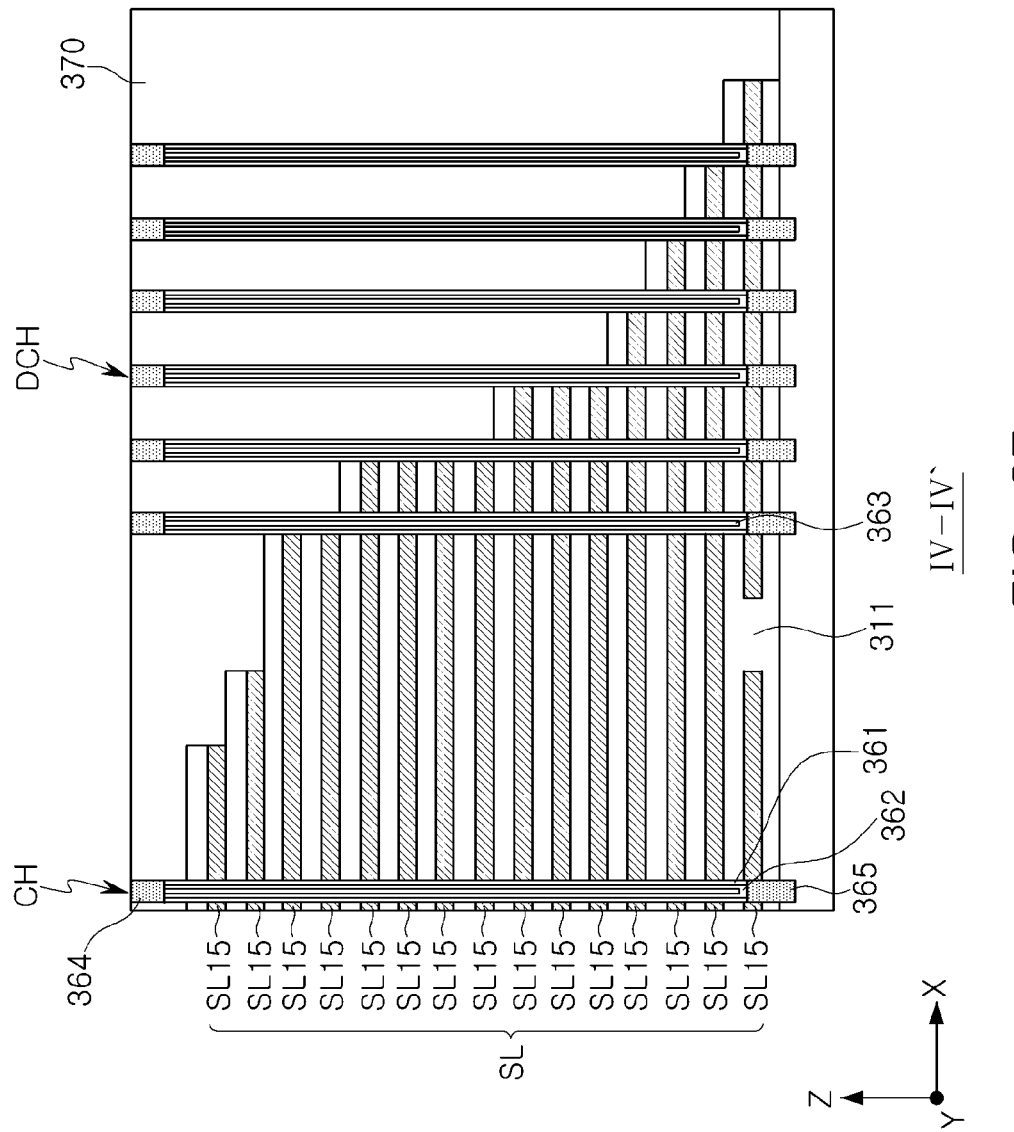

Referring to FIGS. 26 and 27, an interlayer insulating layer 370 may be formed on the pad regions PAD, and a plurality of cell channel structures CH and a plurality of dummy channel structures DCH may be formed. The interlayer insulating layer 370 may be formed on the pad regions PAD to cover the insulating layers IL and the sacrificial layers SL, and may include a silicon oxide or a silicon nitride. In an example, the interlayer insulating layer 370 may be formed by forming a plurality of layers of essentially the same material one on another.

The cell channel structures CH may extend through the interlayer insulating layer 370, the sacrificial layers SL, and the insulating layers IL in a region in which the pad regions PAD are not formed. The dummy channel structures DCH may be disposed adjacent to edges of the sacrificial layers SL and the insulating layers IL in a region in which the pad regions PAD are formed. The cell channel structures CH and the dummy channel structures DCH may have similar structures. Unlike the cell channel structures CH electrically connected to a bit line formed in a subsequent process, the dummy channel structures DCH may be electrically isolated from the bit line.

A process of forming the cell channel structures CH and the dummy channel structures DCH may begin by forming a plurality of channel holes and forming gate insulating layers 361 in the channel holes. Each of the gate insulating layers 361 may include a blocking layer, a charge storage layer, and a tunneling layer sequentially formed from the inner wall of each of the channel holes, and may fill a portion of an internal space of each thereof.

In an example, the blocking layer may include a high-k dielectric material. Here, high-k dielectric material may refer to a dielectric material having a higher dielectric constant that that of a silicon oxide. The tunneling layer may allow charges to be transferred to the charge storage layer in an F-N tunneling manner. The tunneling layer may include, for example, a silicon oxide. The charge storage layer may be a charge trapping layer or a conductive floating gate layer. For example, the charge storage layer may include a dielectric material, quantum dots, or nanocrystals. Here, the quantum dots or the nanocrystals may include conductors, for example, microparticles of a metal or may include a semiconductor.

The blocking layer may include, for example, a silicon oxide ($SiO_2$), a silicon nitride ($Si_3N_4$), a silicon oxynitride (SiON), or a high-k dielectric material. The high-k dielectric material may be one of an aluminum oxide ($Al_2O_3$), a tantalum oxide ($Ta_2O_3$), a titanium oxide ($TiO_2$), a yttrium oxide ($Y_2O_3$), a zirconium oxide ($ZrO_2$), a zirconium silicon oxide ($ZrSi_xO_y$), a hafnium oxide ($HfO_2$), a hafnium silicon oxide ($HfSi_xO_y$), a lanthanum oxide ($La_2O_3$), a lanthanum aluminum oxide ($LaAl_xO_y$), a lanthanum hafnium oxide ($LaHf_xO_y$), a hafnium aluminum oxide ($HfAl_xO_y$), and a praseodymium oxide ($Pr_2O_3$). In an example, the blocking layer may include one or two or more layers. When the blocking layer includes a plurality of layers, the blocking layer may include a high-k dielectric layer and a low-k dielectric layer having different dielectric constants, and the low-k dielectric layer may be disposed adjacent to the charge storage layer. The high-k dielectric layer may include a material having a dielectric constant higher than that of the tunneling layer, and the low-k dielectric layer may have a material having a dielectric constant relatively lower than that of the high-k dielectric layer. By disposing the low-k dielectric layer on a lateral surface of the high-k dielectric layer, an energy band such as the height of a barrier may be adjusted to improve the characteristics of a non-volatile memory device, e.g., erase properties.

The charge storage layer may be a charge trapping layer or a conductive floating gate layer. When the charge storage layer is the conductive floating gate layer, the charge storage layer may be formed by depositing polycrystalline silicon, using a low pressure chemical vapor deposition (LPCVD) process. When the charge storage layer is the charge trapping layer, the charge storage layer may include at least one of a silicon oxide ($SiO_2$), a silicon nitride ($Si_3N_4$), a silicon oxynitride (SiON), a hafnium oxide ($HfO_2$), a zirconium oxide ($ZrO_2$), a tantalum oxide ($Ta_2O_3$), a titanium oxide ($TiO_2$), a hafnium aluminum oxide ($HfAl_xO_y$), a hafnium tantalum oxide ($HfTa_xO_y$), a hafnium silicon oxide ($HfSi_xO_y$), an aluminum nitride ($Al_xN_y$), and an aluminum gallium nitride ($AlGa_xN_y$).

The tunneling layer may include at least one of a silicon oxide ($SiO_2$), a silicon nitride ($Si_3N_4$), a silicon oxynitride (SiON), a hafnium oxide ($HfO_2$), a hafnium silicon oxide ($HfSi_xO_y$), an aluminum oxide ($Al_2O_3$), and a zirconium oxide ($ZrO_2$).

Each of channel layers 362 may be formed on the inside of the gate insulating layer 361, and may include polycrystalline silicon. In an example, the channel layer 362 is formed on the inside of the tunneling layer finally formed among the blocking layer, the charge storage layer, and the tunneling layer of the gate insulating layer 361. The channel layer 362 may have a thickness of about 1/50 to about 1/5 of the diameter of each of the channel holes, and may be formed using an atomic layer deposition (ALD) process or a chemical vapor deposition (CVD) process, similarly to the gate insulating layer 361.

The channel layer 362 may have a hollow annular shape, and an insulating layer 363 may be embedded therein. Prior to the formation of the embedded insulating layer 363, a hydrogen annealing operation of thermally treating a structure in which the channel layer 362 is formed under a gas atmosphere including hydrogen or heavy hydrogen may be additionally performed. The hydrogen annealing operation may allow many parts of crystal defects present in the channel layer 362 to be corrected. Subsequently, a bit line pad 364 may be formed of a conductive material, such as polycrystalline silicon, on the channel layer 362.

Prior to the forming of the gate insulating layer 361, the channel layer 362, and the embedded insulating layer 363 in the channel hole, an epitaxial layer 365 may be formed by applying a selective epitaxial growth (SEG) process to a portion of an upper surface of the substrate 301 exposed within the channel hole. An upper surface of the epitaxial layer 365 may be disposed at a higher level than that of an upper surface of the first sacrificial layer SL1 formed on the bottom of the sacrificial layer SL.

Figure 28:
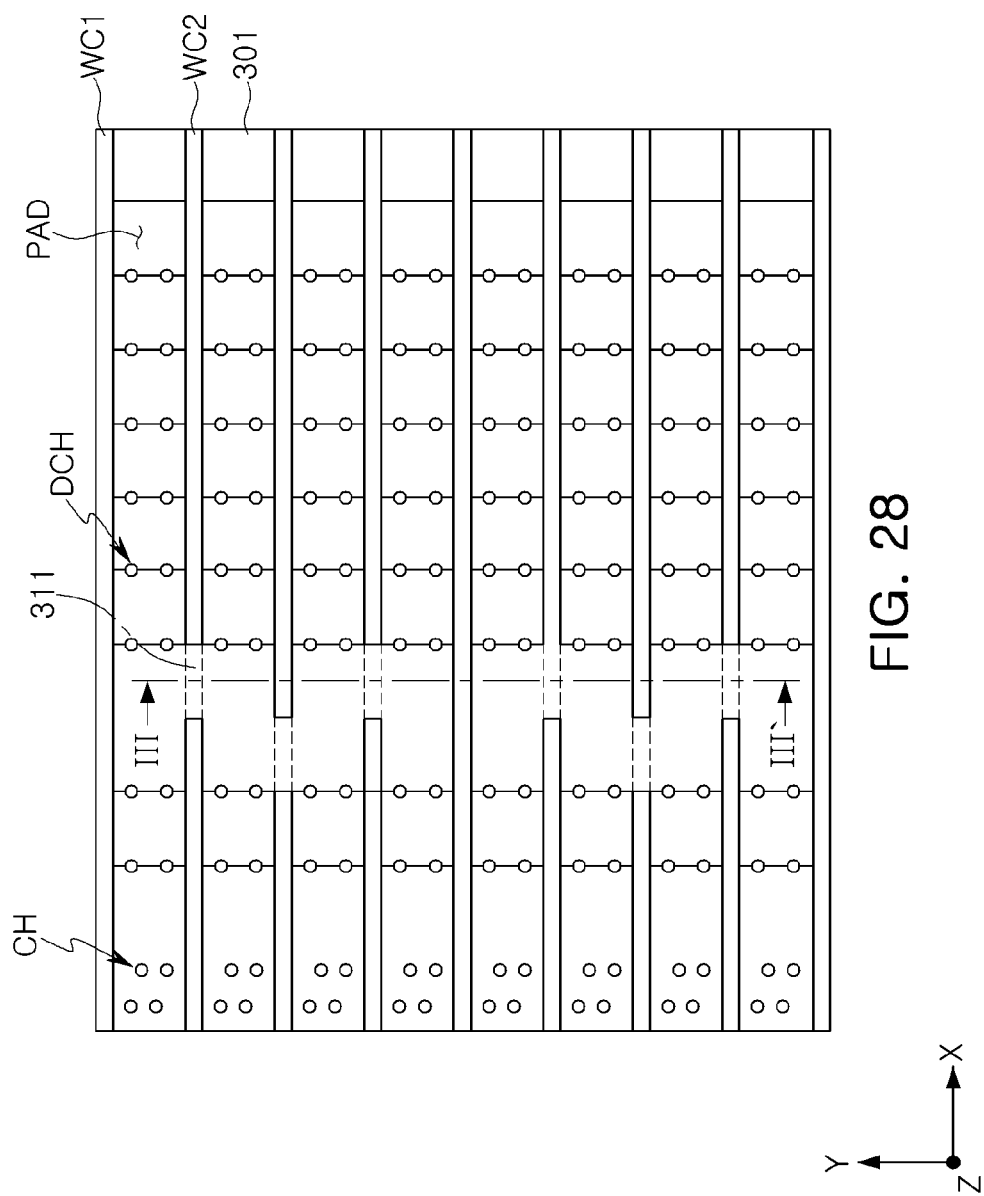
Figure 29:
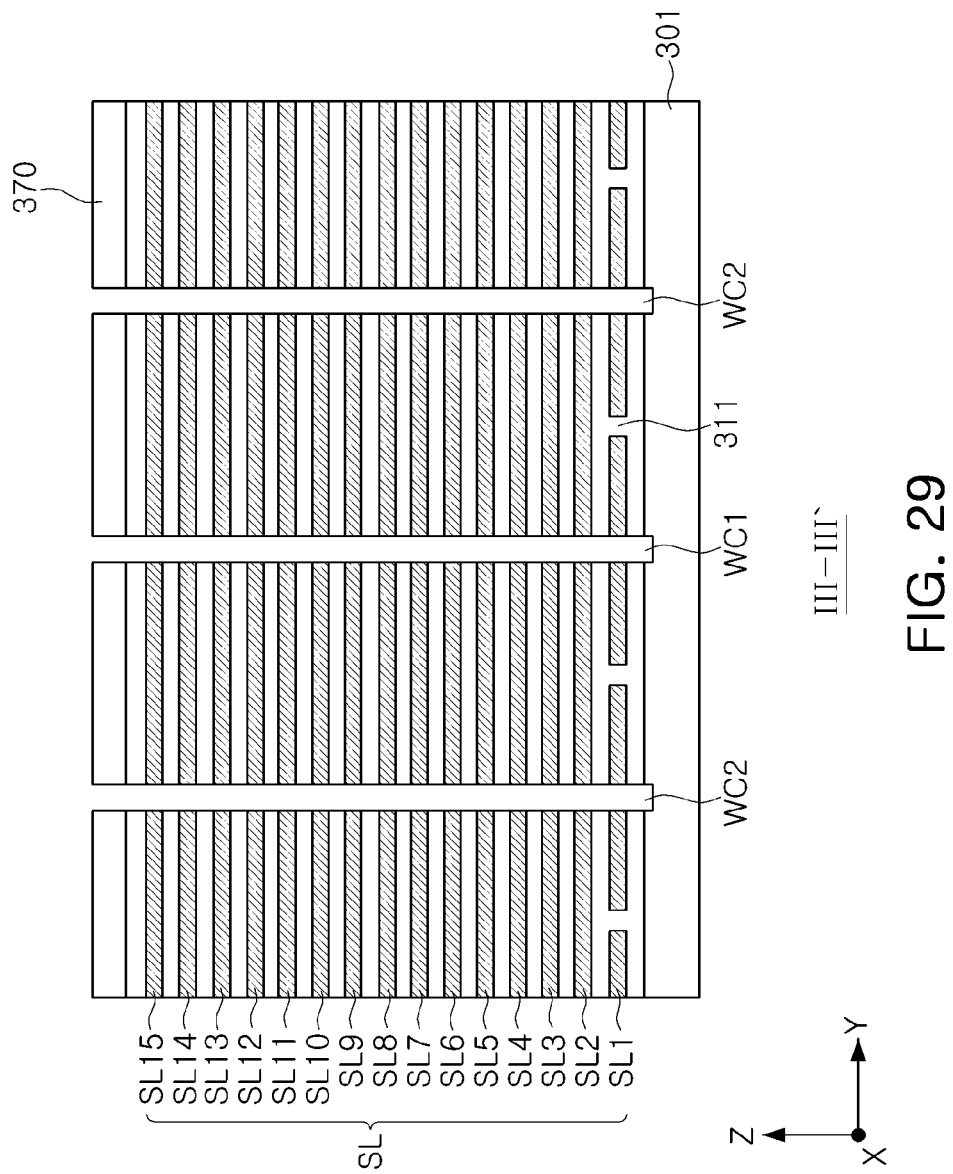

Referring to FIGS. 28 and 29, a plurality of word line cuts WC1 and WC2 may be formed. The word line cuts WC1 and WC2 may be formed in regions in which common source lines may be formed in a subsequent process. As illustrated in FIGS. 28 and 29, the portions of the upper surface of the substrate 301 may be exposed at bottoms of the word line cuts WC1 and WC2.

As illustrated in FIGS. 28 and 29, the word line cuts WC1 and WC2 according to an example may have different forms. Unlike the first word line cuts WC1, the second word line cuts WC2 may have a plurality of regions separated from each other above the isolation region 311 dividing the first sacrificial layer SL1. Furthermore, the second word line cuts WC2 may be disposed between the first word line cuts WC1 adjacent to each other, and may be shorter than the first word line cuts WC1 in the first direction, e.g., the X-axis direction.

Figure 30:
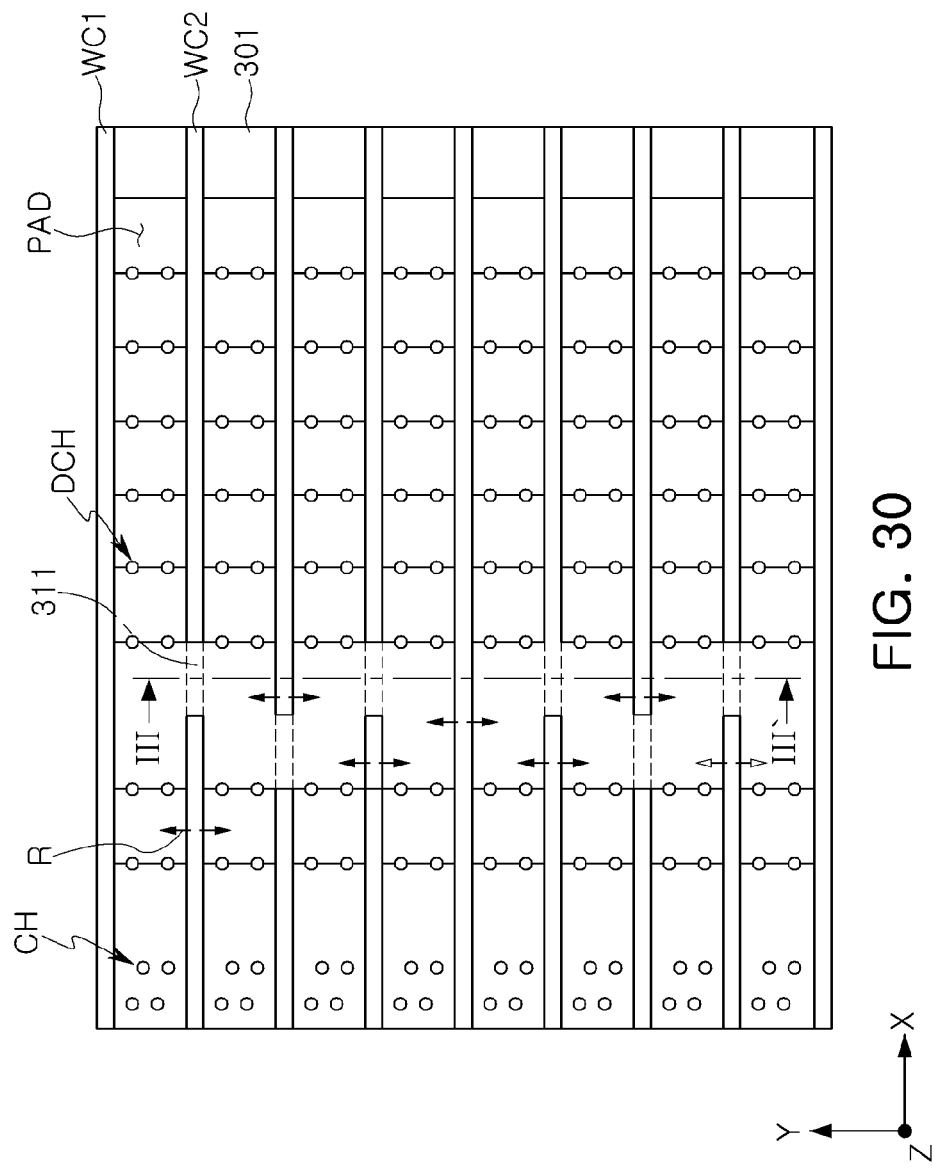
Figure 31:
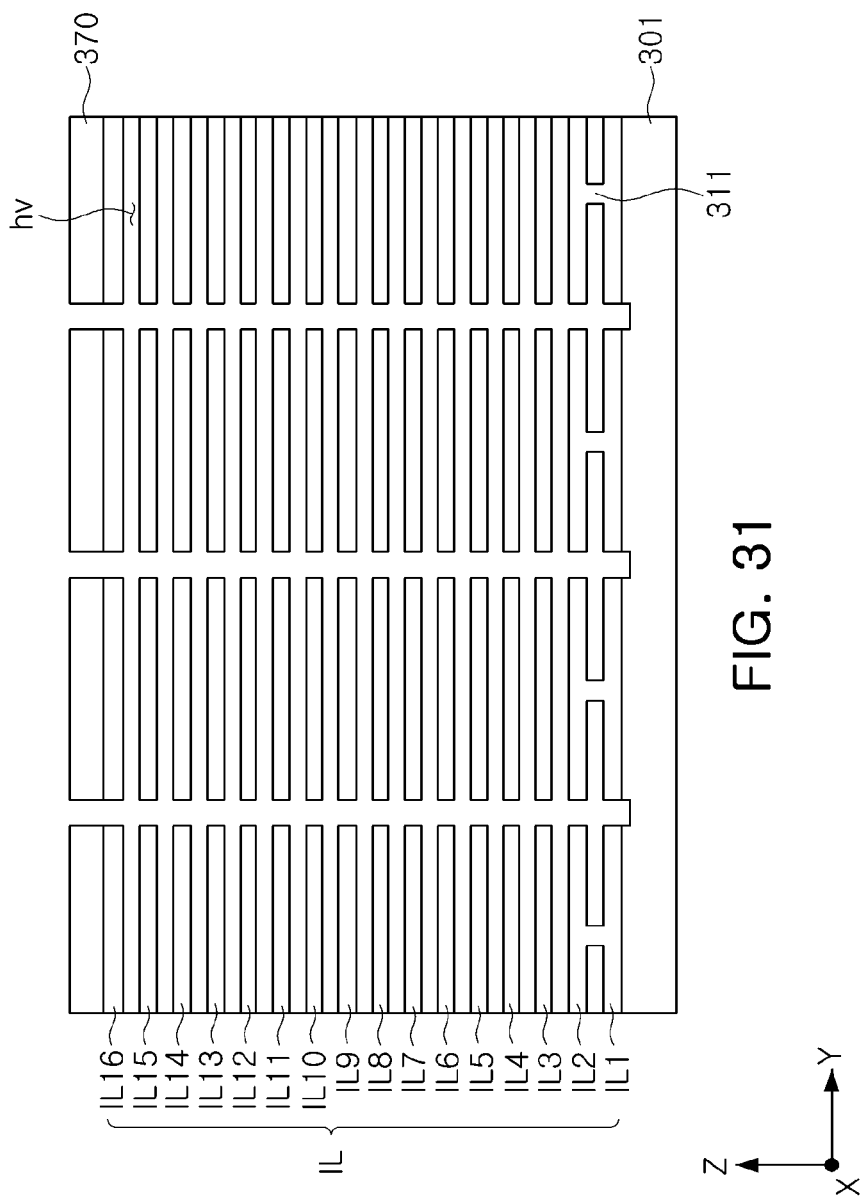
Figure 32:
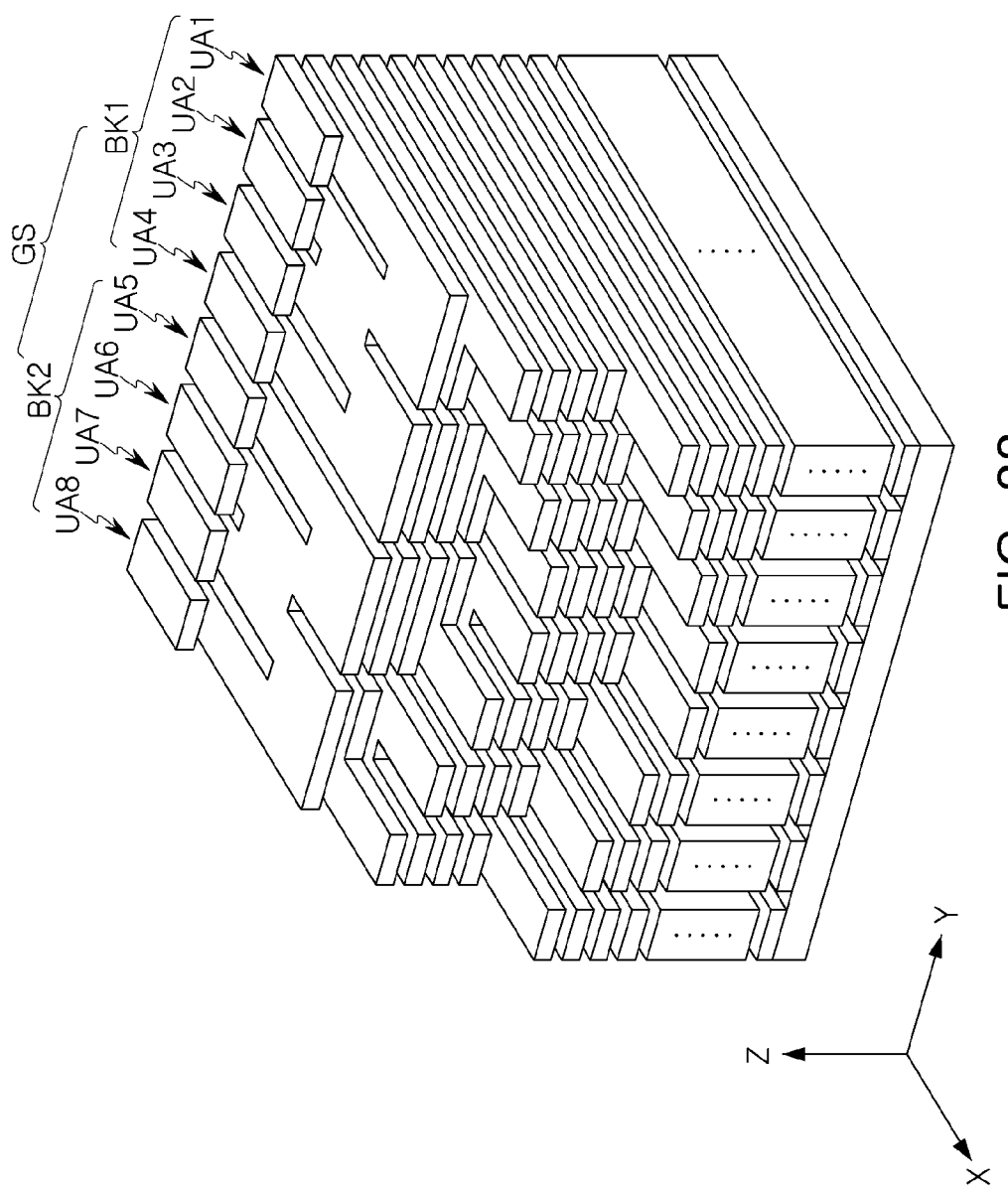

Referring to FIGS. 30 through 32, the sacrificial layers SL may be removed by an etching solution flowing through the first and second word line cuts WC1 and WC2. In an example, the etching solution may include phosphoric acid. When the sacrificial layer SL is removed using the phosphoric acid, a plurality of horizontal voids hv may be formed between the first to sixteenth insulating layers IL1 to IL16 as illustrated in FIGS. 31 and 32. The first to sixteenth insulating layers IL1 to IL16 separated from each other by the horizontal voids hv may be supported by the cell channel structures CH and the dummy channel structures DCH. The isolation region 311 may be formed by filling the opening regions OP with the same material as the insulating layers IL, and horizontal voids hvs thus do not remain in the isolation region 311.

In the process of allowing phosphoric acid to be introduced in order to remove the sacrificial layers SL, the phosphoric acid may be allowed to flow through the first and second word line cuts WC1 and WC2. The phosphoric acid may be introduced through a relatively long path above the isolation regions 311 in which the second word line cuts WC2 may be separated from each other. Thus, when an inflow passage of the phosphoric acid is not properly secured, a portion of the sacrificial layers SL may remain without being removed.

In an example, the isolation regions 311, for example, regions in which the second word line cuts WC2 are separated from each other, may be disposed in zigzag form to thus address such a problem. Referring to FIG. 30, first to fourth inflow passages R through which phosphoric acid flows in the second word line cuts WC2 adjacent to each other may be illustrated. As illustrated in FIG. 30, the problem that the portion of the sacrificial layers SL remain may be addressed by efficiently disposing the first to fourth inflow passages R through which the phosphoric acid flows.

Figure 33:
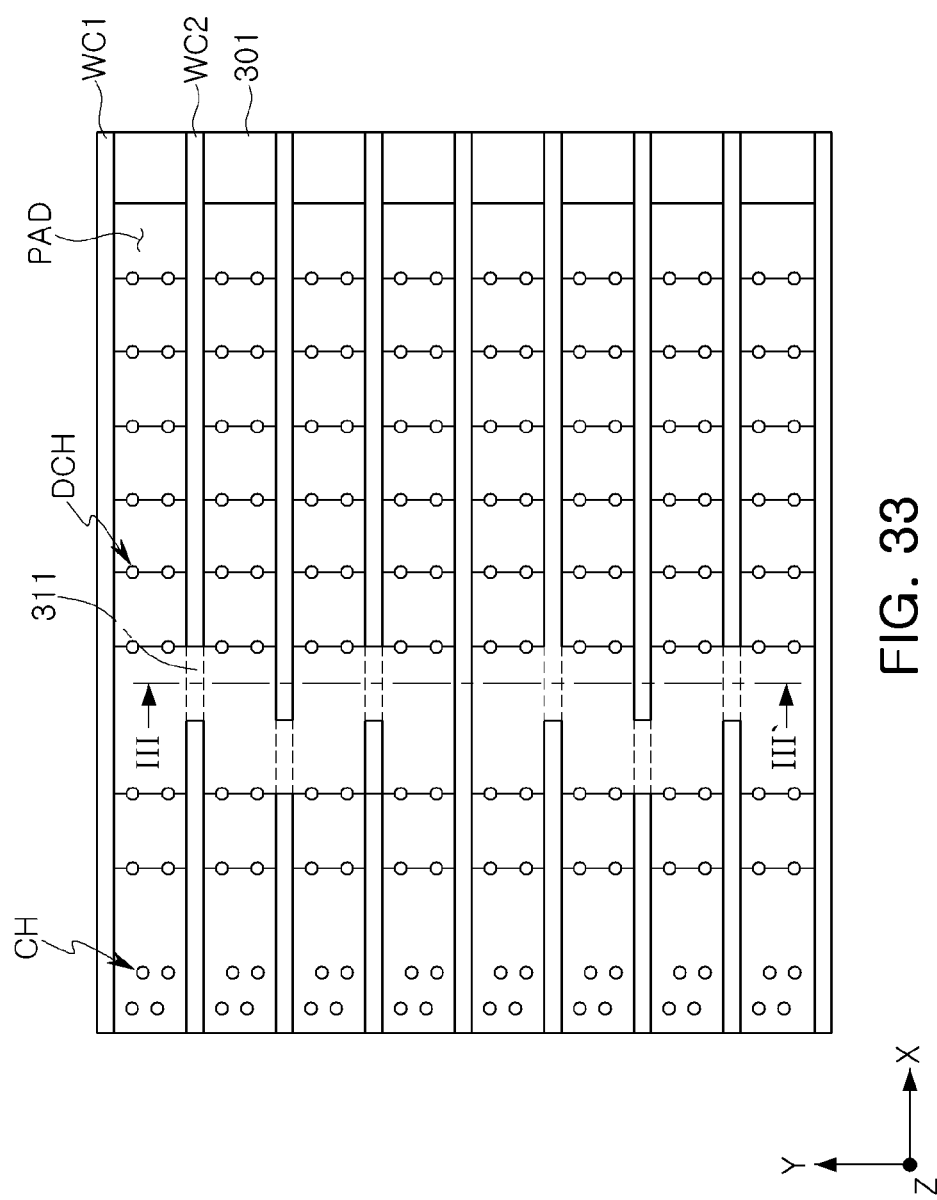
Figure 34:
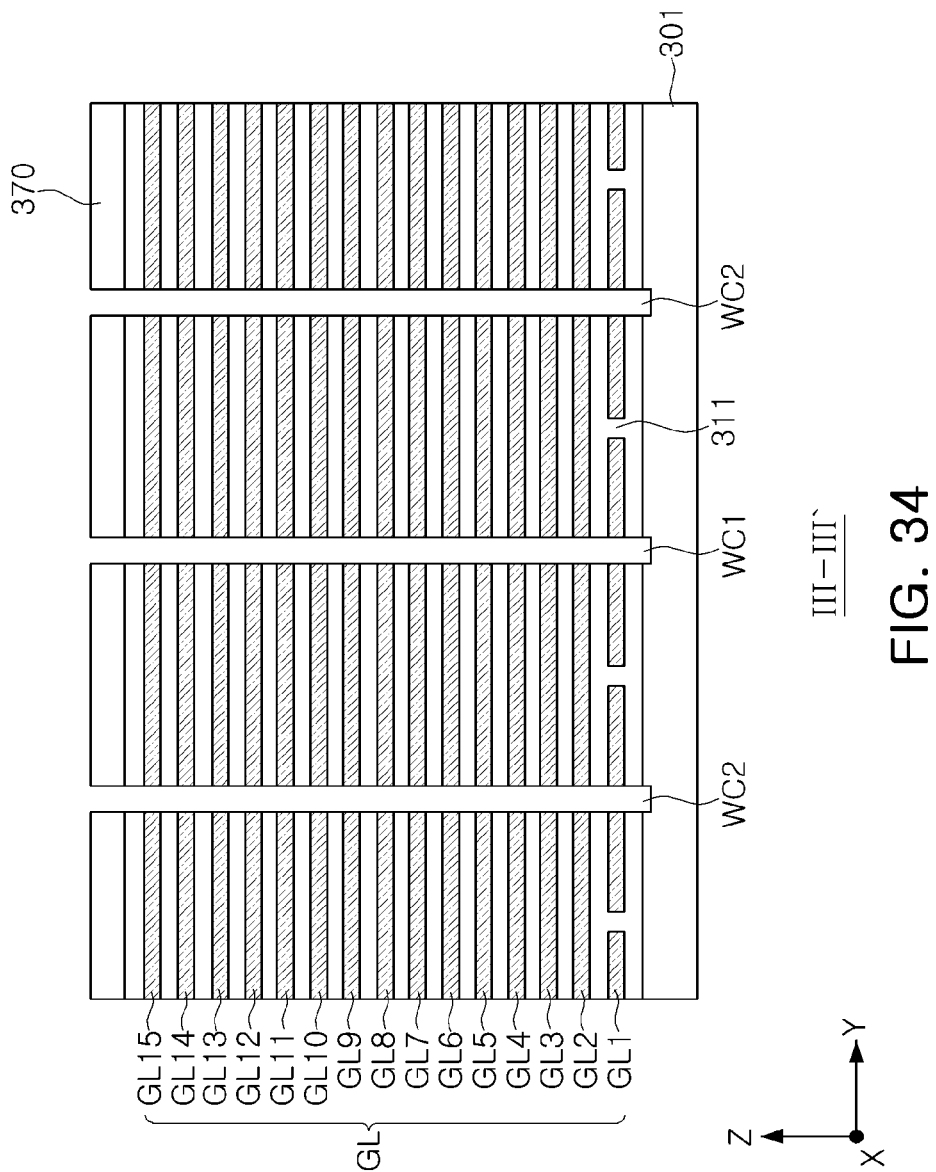

Referring to FIGS. 33 and 34, the first and second word line cuts WC1 and WC2 may allow a conductive material to flow therethrough to thus form a plurality of first to fifteenth gate electrode layers GL1 to GL 15 collectively represented by gate electrode layers GL. The gate electrode layers GL may form a ground select line, word lines, a dummy line, and a string select line. In the example illustrated in FIG. 34, the first gate electrode layer GL1 may form the ground select line, and the second to fourth gate electrode layers GL2 to GL4 and the thirteenth gate electrode layers GL13 may form the dummy line. The fifth to twelfth gate electrode layers GL5 to GL12 may form the word lines, and the fourteenth and fifteenth gate electrode layers GL14 and GL15 may form the string select line.

Referring to FIGS. 33 and 34, each of the second to thirteenth gate electrode layers GL2 to GL13 forming the word lines and the dummy line may form a single word line and a single dummy line within each of the first and second blocks BK1 and BK2 by connecting electrodes SE2 to SE13 collectively represented by a connecting electrode SE. The first gate electrode layer GL1 forming the ground select line may be divided into separate unit electrodes in each of the first to eighth unit areas UA1 to UA8 by the isolation regions 311. The fourteenth and fifteenth gate electrode layers GL14 and GL15 forming the string select line may be divided into separate unit electrodes in each of the first to eighth unit areas UA1 to UA8 by the first and second word line cuts WC1 and WC2. As a result, the respective second to thirteenth gate electrode layers GL2 to GL13 forming the word lines and the dummy line within each of the first and second blocks BK1 and BK2 may be connected to each other in a single region, and the respective first, fourteenth, and fifteenth gate electrode layers GL1, GL14, and GL15 may be separated from each other in separate regions in each of the first to eighth unit areas UA1 to UA8.

The conductive material for forming the gate electrode layers GL may be allowed to flow through the first and second word line cuts WC1 and WC2. The inflow passages R through which the conductive material flows on the upper portions of the isolation regions 311 in which the second word line cuts WC2 may be separated from each other, may be the same as illustrated in FIG. 30. Similarly to the above-described inflow passages R of the phosphoric acid, a problem that a void may be generated in the process of forming the gate electrode layers GL may be addressed by shortening the length of the inflow passages R through the conductive material flows.

Figure 35:
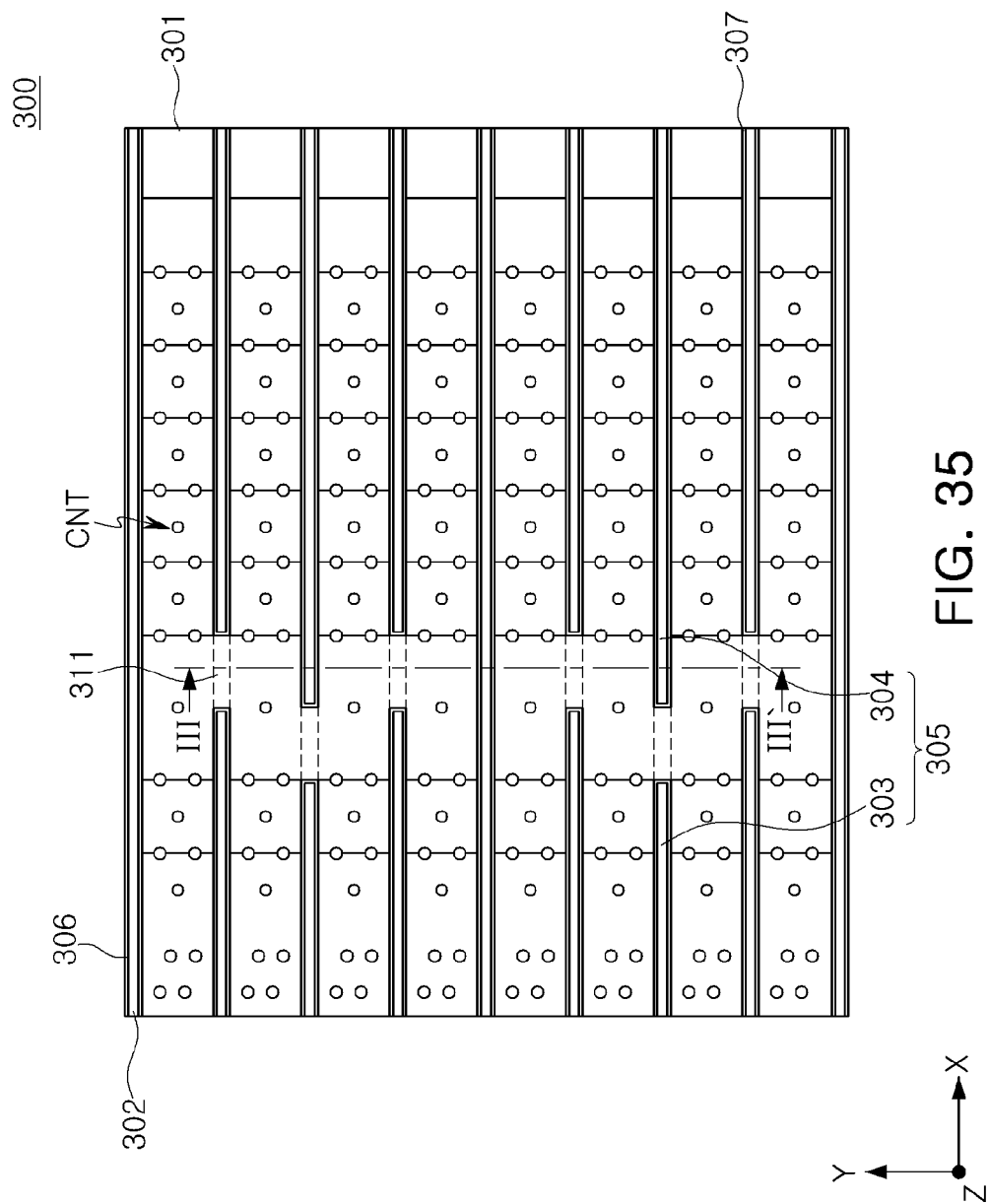
Figure 36:
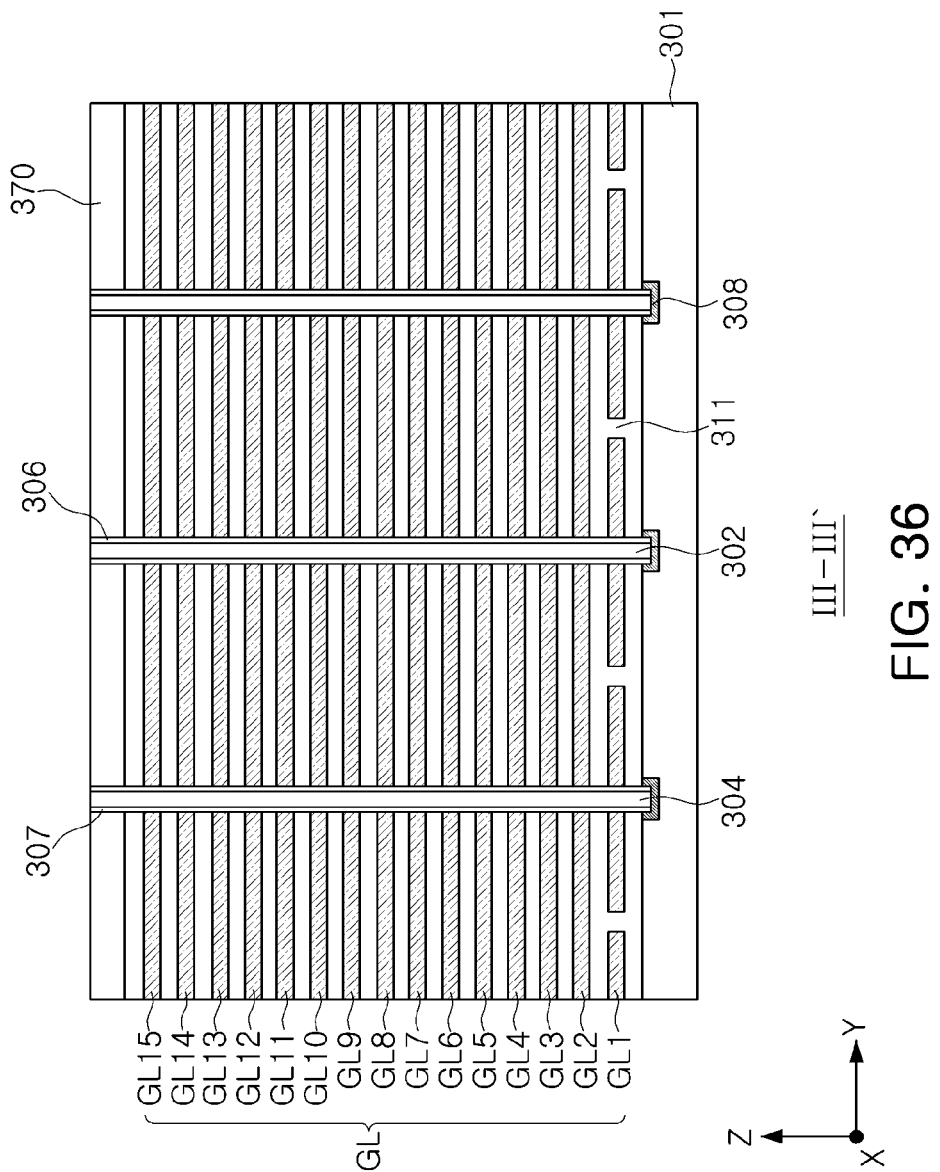

Referring to FIGS. 35 and 36, source regions 308 may be formed in the substrate 301 through the first and second word line cuts WC1 and WC2, and first and second lateral spacers 306 and 307 and the first and second common source lines 302 and 305 may be formed inside the first and second word line cuts WC1 and WC2. Each of the second common source lines 305 separating the first and eighth unit areas UA1 and UA8 from each other in each of the first and second blocks BK1 and BK2 may include a first line 303 and a second line 104. Each of the first to fifteenth gate electrode layers GL1 to GL 15 may be connected to the cell contacts CNTs.

As described above, the respective fifth to twelfth gate electrode layers GL5 to GL 12 forming the word lines within each of the first and second blocks BK1 and BK2 may be connected to each other in a single region. As a result, in an example, an additional wiring for bonding word lines positioned on the same layer as a group is rendered unnecessary.

Thus, a benefit of the inventive concept resides in that a degree of freedom of space utilization of a memory device may be increased such that a larger number of layers of word lines may be provided, thus increasing the capacity of a memory device and the degree of integration thereof.

Figure 37:
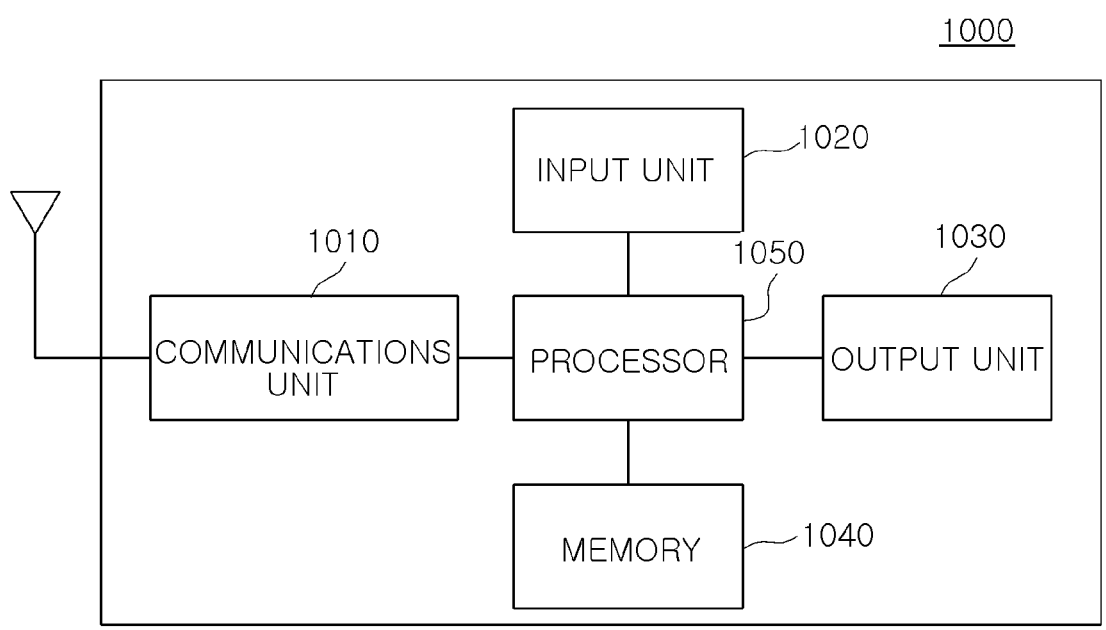
FIG. 37 is a block diagram of an electronic device including a memory device according to an example of the present inventive concept.

FIG. 37 is a block diagram of to an example of an electronic device including a memory device according the present inventive concept.

Referring to FIG. 37, an electronic device 1000 according to an example may include a communications unit 1010, an input unit 1020, an output unit 1030, a memory 1040, and a processor 1050.

The communications unit 1010 may include a wired/wireless communications module such as a wireless Internet module, a local communications module, a global positioning system (GPS) module, or a mobile communications module. The wired/wireless communications module of the communications unit 1010 may be connected to an external communications network based on various communications standards to transmit and receive data.

The input unit 1020 may include a mechanical switch, a touchscreen, a voice recognition module, and the like, as a module provided for a user to control operations of the electronic device 1000. In addition, the input unit 1020 may also include a mouse or a finger mouse device operating based on a trackball or a laser pointer, and may further include various sensor modules which enable a user to input data.

The output unit 1030 may output information processed by the electronic device 1000 in an audio or video format, and the memory 1040 may store a program for processing or control of the processor 1050, or data. The memory 1040 may include at least one of the various examples of memory devices 100, 100A, 200, 200A, and 300 according to the inventive concept as described above, and the processor 1050 may send a command to the memory 1040 depending on required operations to store data in or retrieve data from the memory 1040.

The memory 1040 may be embedded in the electronic device 1000, or may communicate with the processor 1050 through an additional interface. When the memory 1040 communicates with the processor 1050 through the additional interface, the processor 1050 may store data in or retrieve data from the memory 1040 through various interface standards such as secure digital (SD), secure digital high capacity (SDHC), secure digital extended capacity (SDXC), micro SD, universal serial bus (USB), etc.

The processor 1050 may control operations of each component of the electronic device 1000. The processor 1050 may perform control and processing associated with a voice call, a video call, data communications, and the like, or may conduct control and processing for multimedia reproduction and management. The processor 1050 may also process an input entered by a user through the input unit 1020 and output a result thereof through the output unit 1030. Furthermore, the processor 1050 may store or retrieve data required to control operations of the electronic device 1000 to/from the memory 1040 as described above.

As described above, according to an aspect of the present inventive concept, a memory device may include a plurality of unit areas, and each of the unit areas may include a plurality of unit electrodes stacked on a substrate. The unit electrodes forming word lines may be connected to each other at boundaries between the unit areas by a plurality of connecting electrodes to form a plurality of blocks. At least a portion of the connecting electrodes connecting the unit electrodes to each other may be disposed at different positions along a given direction, thus increasing reliability of the memory device.

While various examples of the inventive concept have been shown and described above, it will be apparent to those skilled in the art that modifications and variations could be made to such examples without departing from the scope of the present inventive concept as defined by the appended claims.

What is claimed is:

1. A memory device comprising:
a substrate having an upper surface and source regions at the upper surface;
a stack on the upper surface and including gate electrode layers, each of some of the gate electrode layers including unit electrodes and connecting electrodes, each of the unit electrodes extending longitudinally in a first direction, and each of the connecting electrodes disposed between a pair of the unit electrodes being closest to each other in a second direction and connecting the pair of the unit electrodes to each other;
first common source lines, each of the first common source lines connecting to a respective one of the source regions and extending longitudinally in the first direction to separate the stack into a plurality of blocks; and
second common source lines, each of the second common source lines connecting to a respective one of the source regions and extending longitudinally in the first direction, wherein
each of the second common source lines includes a first line and a second line separated in the first direction, by a respective one of the connecting electrodes, the first line and the second line in each of the second common source lines are disposed at the same position in the second direction,
the first lines included in a pair of the second common source lines being closest to each other in the second direction, in at least one of the plurality of blocks, have different lengths in the first direction,
in at least one of the plurality of blocks, two of the second lines have the same length in the first direction, and one of the second lines between the two of the second lines have a different length from the two of the second lines in the first direction, and
a distance between the first line and the second line included in one of the pair of the second common source lines is substantially the same with a distance between the first line and the second line included in another one of the pair of the second common source lines.

2. The memory device of claim 1, wherein in a region between the first common source lines that are closest to each to other in the second direction, one of the connecting electrodes is offset from another one of the connecting electrodes in the first direction.

3. The memory device of claim 2, wherein two of the connecting electrodes that are closest to each other in the second direction in said region are disposed in different positions in both of the first direction and the second direction.

4. The memory device of claim 1, wherein the first line and the second line included in each of the second common source lines are conductive.

5. The memory device of claim 1, wherein the second lines included in the pair of the second common source lines being closest to each other in the second direction have different lengths in the first direction.

6. The memory device of claim 1, wherein an area between the second lines being adjacent in the second direction includes cell contacts, and
as compared to the area between the second lines being adjacent in the second direction, an area between the first lines being adjacent in the second direction further includes channel structures penetrating the stack and connecting to the upper surface of the substrate.

7. The memory device of claim 1, further comprising:
channel structures connected to bit lines above the stack and penetrating the stack; and
dummy channel structures separated from the bit lines.

8. The memory device of claim 7, wherein the dummy channel structures are disposed adjacent to edges of at least a portion of the gate electrode layers.

9. The memory device of claim 7, wherein the channel structures between the first lines of the second common source lines is disposed farther away from the second lines of the second common source lines, than dummy channel structures between the first lines of the second common source lines.

10. he memory device of claim 1, wherein the number of the unit electrodes closest to one side of the second line included one of the second common source lines is different from the number of the unit electrodes closest to another side of said second line included said one of the second common source lines.

11. The memory device of claim 1, wherein at least a portion of the unit electrodes has a stepped structure in the first direction and the second direction, in an area where said at least a portion of the unit electrodes are connected to cell contacts.

12. A memory device, comprising
a substrate having an upper surface;
gate electrode layers on the upper surface;
channel structures penetrating the gate electrode layers and connected to the upper surface;
first common source lines, each of the first common source lines extending longitudinally in a first direction;
second common source lines, each of the second common source lines extending longitudinally in the first direction and including a first line and a second line; and
cell contacts connected to the gate electrode layers, wherein
at least a portion of the cell contacts disposed at the same position in the first direction have different lengths to each other in a third direction perpendicular to the upper surface, and
the second lines of the second common source lines are disposed between said at least a portion of the cell contacts.

13. The memory device of claim 12, wherein the channel structures are disposed only between the first lines of the second common source lines and between one of the first lines of the second common source lines and the first common source line.

14. The memory device of claim 12, wherein, in an area adjacent to the second lines of the second common source lines, a difference of lengths between the cell contacts closest in the first direction is greater than a difference of lengths between the cell contacts closest in the second direction.

15. A memory device comprising:
a substrate having an upper surface;
gate electrode layers on the upper surface, each of the gate electrode layers including unit electrodes extending longitudinally in a first direction and connecting electrodes disposed between a pair of the unit electrodes being closest to each other in a second direction, and the pair of the unit electrodes disposed in a same height from the upper surface;
first common source lines, each of the first common source lines extending longitudinally in the first direction;
second common source lines, each of the second common source lines extending longitudinally in the first direction and including a first line and a second line; and
wherein both of the first line and the second line are conductive,
in a region between respective ones of the first common source lines that are closest to each other in the second direction, two or more of the second common source lines are disposed, and one among two or more of second common source lines is closest to another one among the two or more of the second common source lines in the second direction,
in the region, a length of the first line included in the one among the two or more of the second common source lines is greater than a length of the first line included in the another one among the two or more of the second common source lines, and a length of the second line included in the one among the two or more of the second common source lines is less than a length of the second line included in the another one among the two or more of the second common source lines.

16. The memory device of claim 15, further comprising:
cell contacts connected to the gate electrode layers, wherein
the gate electrode layers provide string select lines, ground select lines, word lines, and dummy word lines.

17. The memory device of claim 16, wherein some of the cell contacts connected to the word lines and being closest to each other in the second direction have different length in a direction perpendicular to the upper surface.

18. The memory device of claim 16, wherein, in said region between respective ones of the first common source lines that are closest to each other in the second direction, the word lines has a stepped structure in the first direction and the second direction.

19. The memory device of claim 15, wherein the longest unit electrode in the first direction, among the unit electrodes included in one of the gate electrode layers, is connected to at least one of the cell contacts.

* * * * *